United States Patent
Lee et al.

(10) Patent No.: US 6,603,242 B2
(45) Date of Patent: Aug. 5, 2003

(54) PIEZOELECTRIC TRANSDUCER APPARATUS HAVING INDEPENDENT GAIN AND PHASE CHARACTERISTICS FUNCTIONS OF THE FOURTH-ORDER PARTIAL DIFFERENTIAL EQUATIONS

(75) Inventors: Chih-kung Lee, Taipei (TW); Yu-hsiang Hsu, Taipei (TW); Der-chang Hsieh, Taipei (TW)

(73) Assignee: Advancewave Technology, Inc., Taipei (TW)

( * ) Notice: Subject to any disclaimer, the term of this patent is extended or adjusted under 35 U.S.C. 154(b) by 40 days.

(21) Appl. No.: 09/995,244

(22) Filed: Nov. 26, 2001

(65) Prior Publication Data

US 2002/0130593 A1 Sep. 19, 2002

(30) Foreign Application Priority Data

Nov. 24, 2000 (TW) ........................................ 89125056 A

(51) Int. Cl.[7] ............................................. H01L 41/047
(52) U.S. Cl. ........................ 310/365; 310/366; 310/800
(58) Field of Search ................................ 310/365, 366, 310/800

(56) References Cited

U.S. PATENT DOCUMENTS

| | | | | |
|---|---|---|---|---|
| 4,490,641 A | * | 12/1984 | Takeuchi et al. ............ | 310/366 |
| 4,692,722 A | * | 9/1987 | Reichel, deceased et al. ... | 333/142 |
| 5,149,673 A | * | 9/1992 | MacDonald et al. ......... | 438/611 |
| 5,400,788 A | * | 3/1995 | Dias et al. .................... | 600/459 |
| 6,050,679 A | * | 4/2000 | Howkins ....................... | 347/72 |
| 6,088,894 A | * | 7/2000 | Oakley et al. .............. | 29/25.35 |
| 6,510,738 B1 | * | 1/2003 | Lee et al. ...................... | 73/579 |
| 6,522,052 B2 | * | 2/2003 | Kihara et al. ................ | 310/366 |

* cited by examiner

Primary Examiner—Nestor Ramirez
Assistant Examiner—J. Aguirrechea
(74) Attorney, Agent, or Firm—J.C. Patents

(57) ABSTRACT

A piezoelectric transducer apparatus comprises at least one piezoelectric unit and a body structure. Each of the at least one piezoelectric unit has a piezoelectric block and at least one pair of electrodes. Each electrode is adhered to one surface of the piezoelectric block. Each of the at least one piezoelectric unit is adhered to the surface of the body structure with the electrode exposed externally. The transducer apparatus has a generalized sensor equation which can be modeled in a fourth-order partial differential equation mathematical system. At least one of the electrodes or the piezoelectric block of each of the at least one piezoelectric unit has a shape matched to a desired body strain pattern existing in the body structure wherein the electrode of each of the at least one piezoelectric unit may excite a strain pattern in the body structure that is the same as the desired body strain pattern. The body structure of any structural configuration may have a resolved electrode shape that results in the disengagement of the phase and gain characteristics of the piezoelectric construction based on that particular body structure.

16 Claims, 20 Drawing Sheets

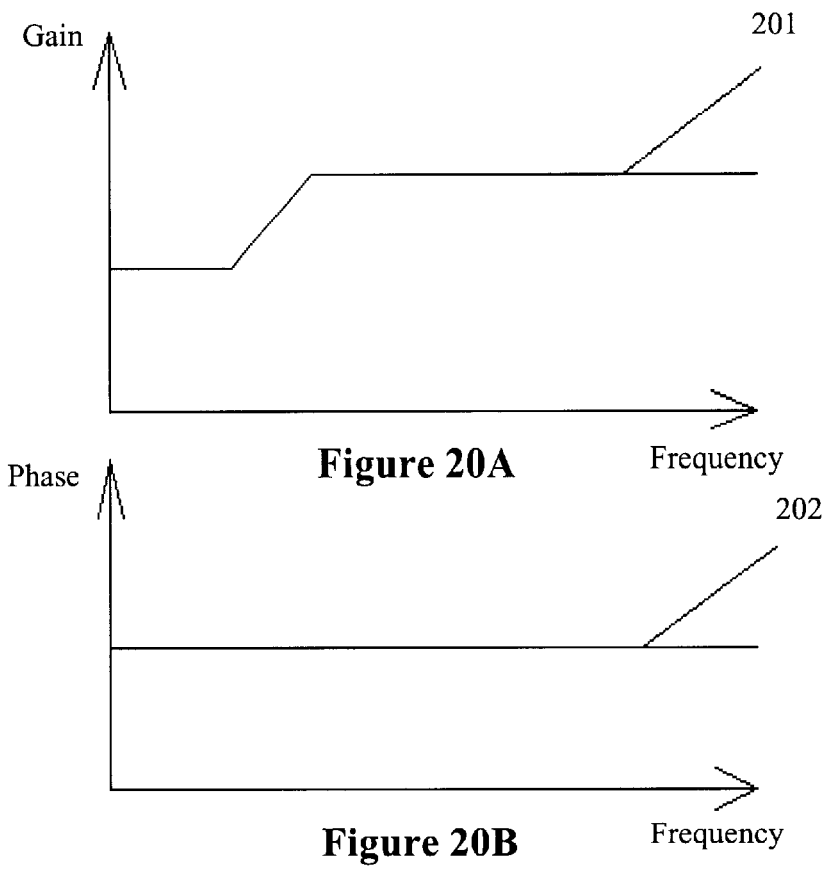
Figure 20A
Figure 20B
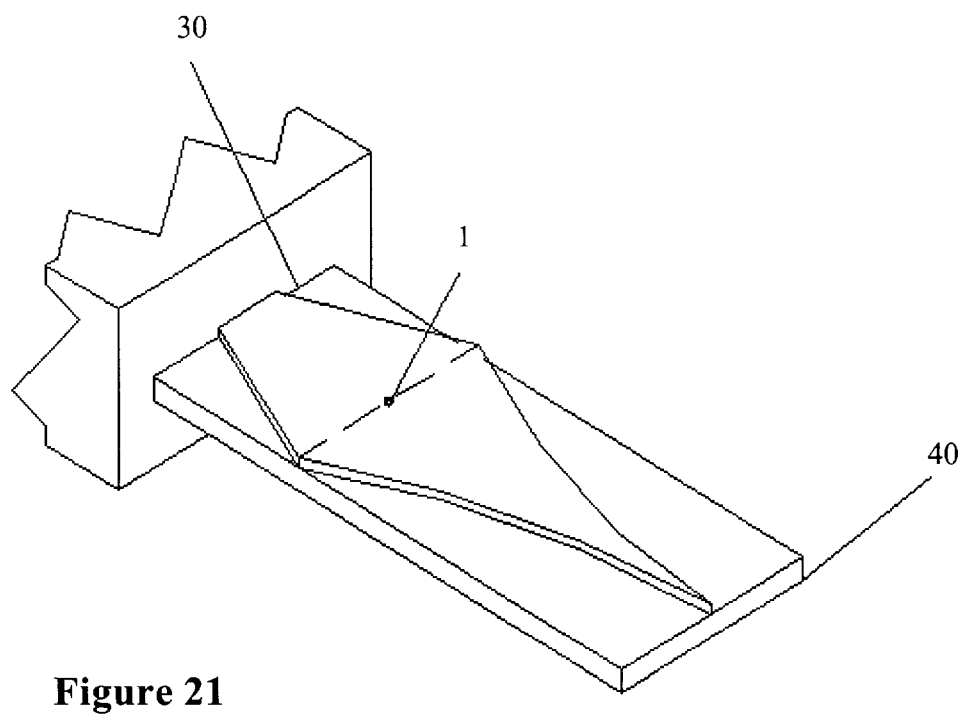
Figure 21

PIEZOELECTRIC TRANSDUCER APPARATUS HAVING INDEPENDENT GAIN AND PHASE CHARACTERISTICS FUNCTIONS OF THE FOURTH-ORDER PARTIAL DIFFERENTIAL EQUATIONS

This application claims the priority benefit of Taiwan application serial no. 89125056, filed Nov. 24, 2000.

FIELD OF THE INVENTION

This invention relates in general to piezoelectric transducers and, in particular, to a piezoelectric transducer apparatus having independent gain and phase characteristic functions of the fourth-order partial differential equations.

BACKGROUND OF THE INVENTION

Piezoelectricity is a phenomenon in which positive and negative electric charges appear on opposite sides of some non-conducting crystals when subjected to mechanical pressure. The converse piezoelectric effect, electrostriction, is the property of some non-conductors, or dielectrics, that deform slightly under the application of an electric field. Piezoelectricity and electrostriction are the reciprocating conversions of mechanical and electrical energy back and forth by piezoelectric workpieces that can be utilized in various applications such as vibration detection and actuation of controlled structures.

Traditional piezoelectric point sensors are used primarily for the detection and measurement of vibrations on a specific point on an examined structure. Shape and type of these piezoelectric sensors can be modified in order to meet the need for the detection of, for example, the vibration of an examined structure in the axial direction. Such sensors are easily customizable to various structural configurations and have been widely utilized in many applications.

However, these prior-art piezoelectric point sensors have a basic characteristic that limits their application. Frequency response characteristics of these point sensors are self-constrained by characteristics of their own structural configuration. For example, traditional point sensors are limited to their useful frequency response ranges due to their structural configuration characteristics. Electronic circuitries have to be employed based on the traditional filter theory. However, sensor frequency response characteristics are thus altered such that their usefulness jeopardized.

Further, these prior-art piezoelectric point sensors can only be useful for the detection of the structural characteristics of single points on an examined structure. One single-point sensor does not reveal the structural characteristics of an examined target in their entirety. When the scope of sense and detection for a target structure needs to be relatively large, excessive number of point sensors have to be installed. The resulted vast amount of information collected by these sensors presents processing problems for the detection system. As a result, utilization of large numbers of these point sensors in applications such as real time control of a structure becomes complicated and unrealistic.

On the other hand, since the emergence of distributed sensor theories in the 1980s, it has become clear that useful bandwidth of piezoelectric sensors can be designed and controlled flexibly to an extent. This is possible by control and adjustment in parameters such as shape and polarization direction of the electrode of a distributed sensor. Due to the fact that the electrode of a distributed sensor is distributed continuously over an extent in space, it is possible for a distributed sensor to measure the overall structural vibration information of an examined target structure. Measurement of force distribution in the structure in the sensed extent is also possible. However, since different distributed sensor configurations have to be implemented costly for the measurement of different target structures, the design and construction efforts in these distributed sensors therefore limit their application.

Based on traditional piezoelectricity theories, gain and phase characteristics for electrical signals detected in piezoelectric devices, either those for mechanical vibration sensing or those for electrical signal filtering, are interdependent. The inter-relationship between the gain and phase characteristics for piezoelectric devices that has been difficult to control have placed limitations on their design.

SUMMARY OF THE INVENTION

It is therefore an object of the present invention to provide a piezoelectric transducer apparatus having independent gain and phase characteristic functions.

The present invention achieves the above and other objects by providing a piezoelectric transducer apparatus that comprises at least one piezoelectric unit and a body structure. Each of the at least one piezoelectric unit has a piezoelectric block and at least one pair of electrodes. Each electrode is adhered to one surface of the piezoelectric block. Each of the at least one piezoelectric unit is adhered to the surface of the body structure with the electrode exposed externally. The transducer apparatus has a generalized sensor equation which can be modeled in a fourth-order partial differential equation mathematical system. At least one of the electrodes or the piezoelectric block of each of the at least one piezoelectric unit has a shape matched to a desired body strain pattern existing in the body structure wherein the electrode of each of the at least one piezoelectric unit may excite a strain pattern in the body structure that is the same as the desired body strain pattern. The body structure of any structural configuration may have a resolved electrode shape that results in the disengagement of the phase and gain characteristics of the piezoelectric construction based on that particular body structure.

BRIEF DESCRIPTION OF THE DRAWINGS

FIGS. 20A and 20B respectively show the gain and phase characteristics as functions of frequency for an embodiment of a high-pass filter based on the inventive piezoelectric sensor apparatus having a fixed-free cantilever beam structure;

FIG. 21 is a perspective view illustrating the electrode design of an asymmetric effective surface having a target origin that is neither located at the body structural center nor at the body structural boundary;

DETAILED DESCRIPTION OF THE INVENTION

Figure 1A:
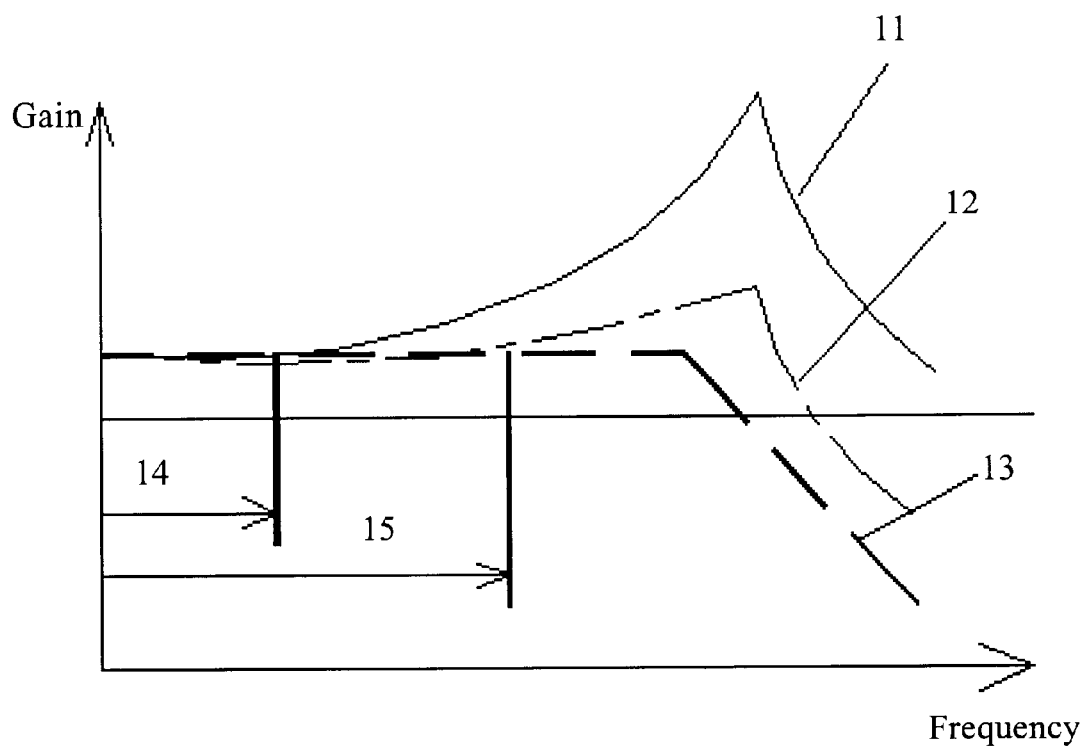
FIGS. 1A and 1B respectively show the gain and phase characteristics as functions of frequency for a piezoelectric sensor construction having incorporated spatial filter.
Figure 1B:
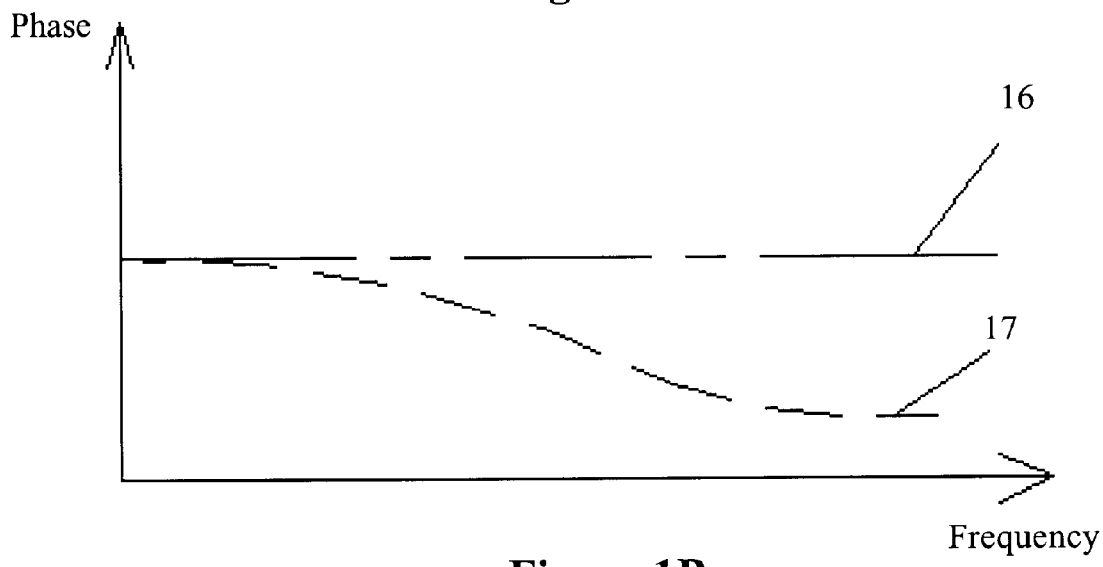

FIGS. 1A and 1B respectively show the gain and phase characteristics as functions of frequency for a piezoelectric sensor construction having incorporated the concept of a spatial filter. In the gain characteristics of FIG. 1A, a sensor with a conventional sensor structural configuration has a gain characteristics represented by the curve 11, which has a useful bandwidth within the frequency range generally represented by reference numeral 14. By contrast, another sensor incorporating the design concept of a spatial filter into its structural configuration has the gain characteristics 12, with a useful bandwidth 15. This gain characteristics 12 is the result of incorporation of the characteristics 13 of a spatial filter into the characteristics 11 of the plain sensor. As is illustrated, the useful bandwidth 15 achieved by the sensor incorporating the spatial filter concept (having the characteristics 12) is substantially larger than 14 of the other (11).

Meanwhile, in the phase characteristics of FIG. 1B, characteristics curves 16 and 17 represent the phase characteristics of the sensors described herein (FIGS. 1A) having and having not incorporated the concept of a spatial filter respectively. The substantially flat characteristic shown by curve 16 indicates that the phase characteristics of the sensor incorporating the spatial filter concept is able to be disengaged from the its own gain characteristics. How this is possible and achieved in accordance with the present invention are described in the following paragraphs.

Figure 2A:
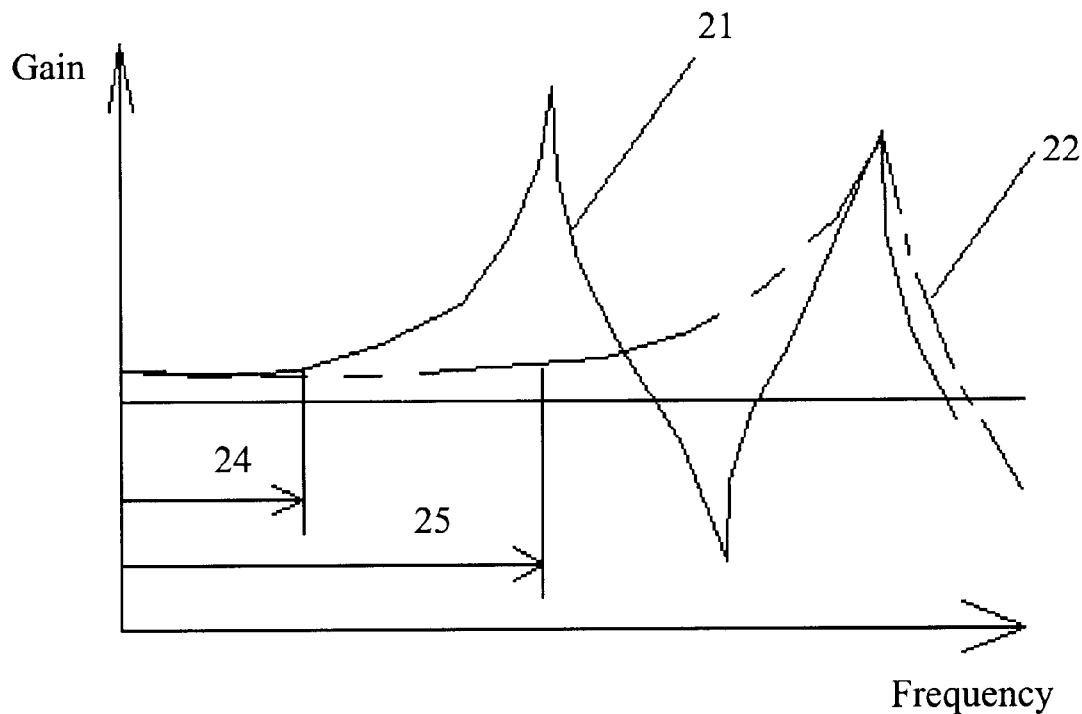
FIGS. 2A and 2B respectively show the gain and phase characteristics as functions of frequency for a piezoelectric sensor construction having incorporated modal sensor.
Figure 2B:
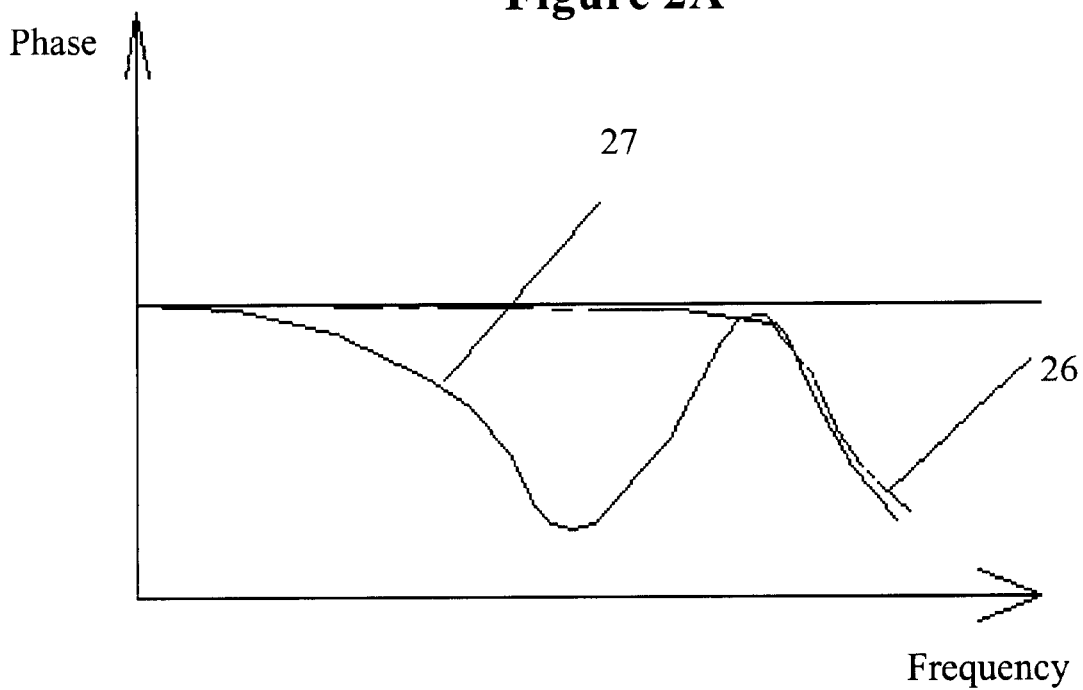

FIGS. 2A and 2B respectively show the gain and phase characteristics as functions of frequency for a piezoelectric sensor construction having incorporated the concept of a modal sensor. In the gain characteristics of FIG. 2A, a sensor with a conventional point sensor structural configuration has a gain characteristics represented by the curve 21, which has a useful bandwidth within the frequency range 24. Note that in the frequency range of the depicted gain characteristic, the conventional point sensor has first and second modes of gain peaks included.

By contrast, another sensor incorporating the design concept of a modal sensor into its structural configuration has the gain characteristics 22, with a useful bandwidth 25. The useful bandwidth 25 achieved by the sensor incorporating the modal sensor concept is larger than 24 of the other as the first mode in the point sensor has been expelled. Only second mode is present. Similar as in the case of FIG. 1A, gain characteristics 22 is the result of incorporation of the characteristics of a modal sensor into the characteristics 21 of a plain point sensor.

On the other hand, in the phase characteristics of FIG. 2B, characteristics curves 26 and 27 represent the phase characteristics of the sensors described in FIGS. 2A and 2B having and having not incorporated the concept of a modal sensor respectively. The substantially flat characteristic extending into the high end of the frequency scale shown by curve 26 indicates that the phase characteristics of the sensor incorporating the modal sensor concept is able to be disengaged from its own gain characteristics. Again, details of this achievement of the present invention are described in the following paragraphs. Note, in FIG. 2B, that the flat line 28 identifies a constant phase angle that assists to demonstrate the substantial linearity of the characteristics curve 26 up to the high end of the frequency scale.

It should be noted that each of both the methodologies of modal expansion and characteristic polynomial expansion can be employed to implement adjustment on the mathematical gain function of the structural system of the body construction of a piezoelectric sensor apparatus. It is possible to achieve phase adjustment without following the principles of a causal system as in the theory of traditional electronic filter circuits. One of the specially devised exception to the principle of causal systems is a sensor system in which the system gain expressed as a function of frequency can be effectively adjusted without incurring a corresponding shifts in its phase. Details are described below.

In the following description of the inventive piezoelectric transducer apparatus, including how the disengagement between the gain and phase characteristics in the apparatus can be achieved, a particular type of fourth-order body structure for the construction of the apparatus is used as an example of the mathematical development. In general, a piezoelectric transducer apparatus of the present invention comprises a number of piezoelectric sensor units adhered to the surface of the sensor body structure, as will be described in detail in the following paragraphs with reference to FIG. 3 of the drawing.

The description that the body structure used for the construction of the inventive piezoelectric transducer apparatus is fourth order is referring to the fact that the constitutive equation for the apparatus is of fourth-order. Note, however, that although fourth-order structural systems are utilized herein for the description of the present invention, it is not the intention of this description to limit the scope of the present invention to apparatuses having fourth-order constructions. Rather, the underlying principle of the present invention indicates that a body structure of any structural configuration may have a resolved electrode shape that achieves disengagement of the phase and gain characteristics of the piezoelectric construction based on that particular body structure.

A mathematical modeling and analysis methodology will be described in the following paragraphs that can be employed to determine the electrode shape matched to the three-dimensional body strain pattern existing in a body structure of any shape. In a piezoelectric construction having a matched electrode, the body strain pattern existing in the body structure of the piezoelectric construction matches the strain pattern if excitation is provided by the matched electrode.

The governing equation of a thin-plate piezoelectric workpiece is described in the following paragraphs.

Based on the first law of thermodynamics, the constitutive equations for the piezoelectric workpiece can be expressed as:

$$T_p = c_{pq}^E S_q - e_{kp} E_k, \quad (1)$$

$$D_i = e_{iq} S_q + \in_{ik}^S E_k, \quad (2)$$

or $$S_p = s_{pq}^E T_q + d_{kp} E_k, \quad (3)$$

$$D_i = d_{iq} T_q + \in_{ik}^T E_k, \quad (4)$$

wherein i,j,k=1–3, p,q=1–6, $T_p$ and $S_q$ are stress and strain respectively, $E_k$ is the electric field intensity, $D_i$ is the electric displacement and $c_{pq}$, $\in_{ij}$, $s_{pq}=(c_{pq})^{-1}$, $e_{kp}$ and $d_{ip}$ are, respectively, the elastic stiffness matrix, the permittivity matrix, the elastic compliance matrix, the piezoelectric stress matrix and the piezoelectric strain matrix, as defined in the IEEE Compact Matrix Notation system. The notation system was published in 1987 by IEEE in the *IEEE Standard on Piezoelectricity*.

The signal measured over the surface of the electrode of a piezoelectric workpiece can be determined employing Gauss' theorem:

$$q(t) = \int_S \underline{D} \cdot d\underline{\sigma}. \qquad (5)$$

Piezoelectric sensor equation can be obtained by considering the inter-relationship between strain and stress of the sensor units attached to the body structure of the system, utilizing the governing equations for piezoelectricity. Thus, the sensor equation for the thin piezoelectric workpieces utilized as the sensor units can be expressed as:

$$q(t) = \iint_{S(12)} \left[ e_{31} \frac{\partial u_0}{\partial x} + e_{32} \frac{\partial v_0}{\partial y} + e_{36} \left( \frac{\partial u_0}{\partial y} + \frac{\partial v_0}{\partial x} \right) \right] dx dy - \qquad (6)$$

$$z^0 \iint_{S(12)} \left[ e_{31} \frac{\partial^2 w}{\partial x^2} + e_{32} \frac{\partial^2 w}{\partial y^2} + 2e_{36} \frac{\partial^2 w}{\partial xy} \right] dx dy$$

In equation (6), u and v in the first integral part to the right of the equal sign are the displacements in the x and y directions of the system respectively, which represent the response presented by the system due to the in-plane strain. On the other hand, w in the second integral part in the equation is a measure of the bending displacement of the system, which represents the response presented by the system due to the out-of-plane strain.

Figure 3:
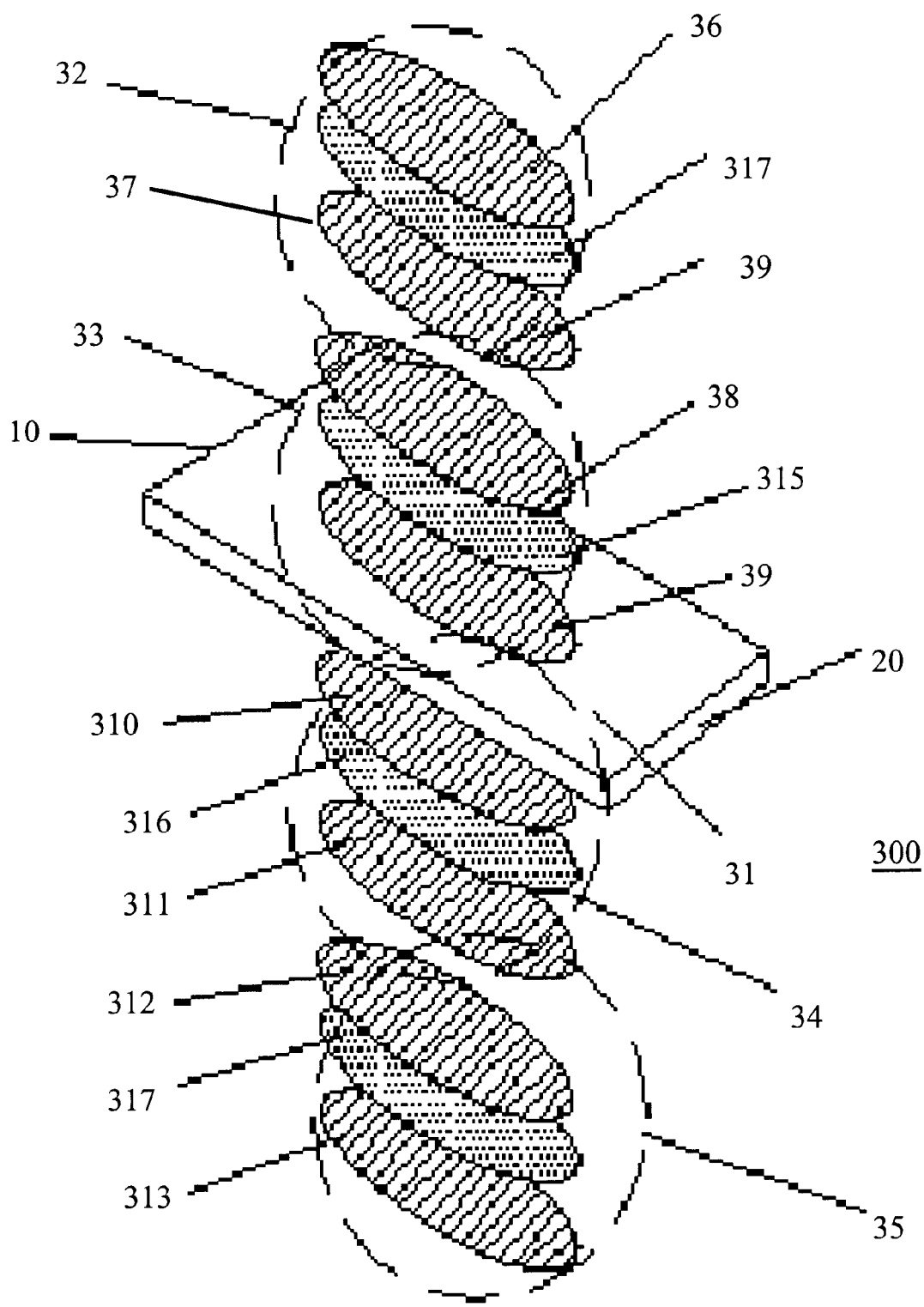
FIG. 3 is an exploded perspective view of a piezoelectric transducer apparatus in accordance with an embodiment of the present invention schematically showing the basic structural configuration thereof.

FIG. 3 is an exploded view of a piezoelectric transducer apparatus in accordance with an embodiment of the present invention. The illustration schematically shows the basic structural configuration of a typical piezoelectric transducer apparatus that can be modeled mathematically as a fourth-order system. In the drawing, the apparatus is shown to comprise a sensor body structure 31, and four piezoelectric sensor units 32, 33, 34 and 35. More or less than four sensor units are possible depending on application.

Each of the piezoelectric sensor units is a piezoelectric workpiece comprising a block of piezoelectric material and at least a pair of surface electrodes. For example, the piezoelectric sensor unit 35 comprises a block of piezoelectric material 317 in the form of a two-dimensional thin plate, and a pair of electrodes 312 and 313 adhered to the opposite side surfaces.

All the surface electrodes for the piezoelectric sensor units, namely electrodes 36, 37, 38, 39, 310, 311, 312 and 313 shown in the drawing, may be prepared in shapes for adequate spatial distribution. Each of the surface electrodes with its designed shape can be selectively adhered to the surface of the block of piezoelectric material. Electric currents in the system, for example, currents arising from strain inside the piezoelectric block, can be collected via these electrodes and relayed to interface circuits connected to the piezoelectric apparatus. Electrodes in the illustrated apparatus such as 36, 39, 310 and 313 may also serve as ground electrodes to provide EMI shielding for the apparatus. Further, opposite remote ends of the piezoelectric sensor body structure 31 identified by reference numerals 10 and 20 respectively may be selected to be the boundary for setting up the boundary condition in the mathematical analysis system of the apparatus.

It is important to note that the construction of the piezoelectric transducer apparatus in accordance with the present invention relies on the employment of the mathematically resolved sensor shape into the piezoelectric sensor units. The sensor shape mathematically resolved for the construction of a sensor unit, however, is not only applicable to the electrodes of the piezoelectric sensor unit but is also applicable to the thin-film piezoelectric material sandwiched between the electrodes. For each piezoelectric sensor unit to be incorporated into the construction of a piezoelectric transducer apparatus of the present invention, at least one of the electrodes or the thin-film piezoelectric material layer must feature the resolved sensor shape.

For the convenience of the description of the present invention, a type of body structure suitable for the construction of the inventive piezoelectric transducer apparatus that can be described and analyzed in fourth-order mathematical modeling systems is examined here. It is an Euler beam, an elongated piece of suitable material, that can be approximated mathematically as one-dimensional body structures. As is comprehensible, this requires that the traverse dimension of the elongated body structure be virtually neglectable compared to the longitudinal dimension.

Mathematically, for a one-dimensional Euler beam that vibrates traverse to the longitudinal direction, the governing equation can be expressed as $$EI \frac{\partial^4 w(x,t)}{\partial x^4} - R \frac{\partial^3 w(x,t)}{\partial t \partial x^2} + \rho A \frac{\partial^2 w(x,t)}{\partial t^2} = 0 \qquad (7)$$

wherein EI is the piezoelectric stiffness constant, A is the cross-sectional area of the structural body, and $\rho$ is density, and x in the expression indicates that the traverse displacements is only concerned in the direction traverse to the longitudinal dimensional direction of the system. Note that in the expression, the damping factor R of the system is taken into consideration.

Mathematical solution to the above governing equation for the one-dimensional Euler beam with traverse vibrations can be obtained employing the technique of characteristic polynomial expansion. For traverse vibrations in the one-dimensional system, the characteristic polynomial expansion is implemented in terms of the traverse displacement of the sensor body structure by performing wave modes. The solution for the body strain, which is a function w(x, t) of time t and the body structure physical dimension x, as obtained for the governing equation (7), can be expressed as $$w(x,t) = [w_{lp} e^{(jkR-k)x} + w_{le} e^{(kR-jk)x} + w_{rp} e^{-j(jkR-k)x} + w_{re} e^{-(kR-jk)x}] e^{jwt} \qquad (8)$$

In the solution equation, $w_{lp}$ and $w_{rp}$ are, respectively, the amplitudes of the propagating wave in the left and right directions, and $w_{le}$ and $w_{re}$ are, respectively, the amplitude of the evanescent wave in the left and right directions. These four wave propagation constants will be different depending on the different boundary conditions selected in the mathematical model of the sensor body structure. Vibration characteristics in the one-dimensional body structure of and Euler beam constitute the basis for the construction of very effective tools for the sensing and actuation of structures featuring disengaged phase and gain characteristics in the system.

Thus, piezoelectric transducer apparatus in the form of the one-dimensional elongated body structure such as an Euler beam, which can be modeled in a fourth-order partial differential equation mathematical system, can be described in a generalized sensor equation $$q(k) = -z_k^0 e_{31} k^2 \int_0^a \varsigma(x) [-w_{lp} e^{jkx} + w_{le} e^{kx} - w_{rp} e^{-jkx} + w_{re} e^{-kx}] dx \qquad (9)$$

Note that this is assuming a fourth-order system. Also note that $\varsigma(x)$ represents the effective surface electrode of the piezoelectric workpiece expressed as a function of the dimension x. $\varsigma(x)$ in the body structure of the system is a function of only one variable, the physical dimension of the body structure in the longitudinal direction.

Effective surface electrode ζ(x), being expressed as a function of the dimensional variable x, is a convenient means in the form of a mathematical equation for determining the geometrical shape of the substantial electrode of a piezoelectric sensor unit that is required for the construction of the inventive piezoelectric transducer apparatus.

It can be found in the sensor equation (9) that a fourth-order piezoelectric transducer apparatus of the present invention is capable of being constructed into a vibration detecting device that has disengaged phase and gain characteristics. Filtering effect can be provided by these devices for structural vibration.

Essentially, the underlying concept of the present invention lies in the finding that in the finite body structure of a piezoelectric transducer apparatus, for any three-dimensional body strain pattern existing in the body structure, there exists a corresponding electrode having a specific shape, which, if used to excite the body structure by feeding electric energy into the body structure, generates the same strain pattern. A mathematical modeling and analysis methodology is disclosed by the present invention that can be employed for determining the electrode shape matched to the three-dimensional body strain pattern existing in a body structure of any shape. A piezoelectric transducer apparatus equipped with the resolved electrode shape that matches the strain pattern has a phase characteristics that is independent from the gain characteristics.

The piezoelectric transducer apparatus as illustrated and described in FIG. 3 which incorporates the structural configuration of the spatial filter is able to achieve independence between the gain and phase characteristics for the same piezoelectric system. Various methodologies can be translated into system design parameters for the construction of a piezoelectric transducer apparatus of the present invention. These include, at least, facilitating, in the piezoelectric transducer apparatus being designed, the designation of the target origin, the employment of the concept of wave propagation, the selection of the base of the spatial filter, the superposition of the spatial characteristics of the piezoelectric material in the system, the method of imaging, the selection of the integrated interfacing circuits, the manipulation of the boundary conditions in the mathematical system, the selection of the frequency-selective electrodes of the piezoelectric sensor unit, the application of the wave propagation theory, and the application of electronic circuit feedback schemes.

The underlying concept for the design of spatial filters relies on the utilization of two-sided Laplace transform as the basic design tool. The only condition fulfilling the effectiveness of spatial filtering falls onto the origin 0 of the two-sided Laplace transform. This origin serves as the target origin for implementing the design of the piezoelectric transducer apparatus of the present invention. Proper selection of this target origin in the system of the piezoelectric sensor construction (300 in FIG. 3) facilitates optimized design results for various piezoelectric transducer apparatus featuring different effectiveness for different applications.

Figure 4:
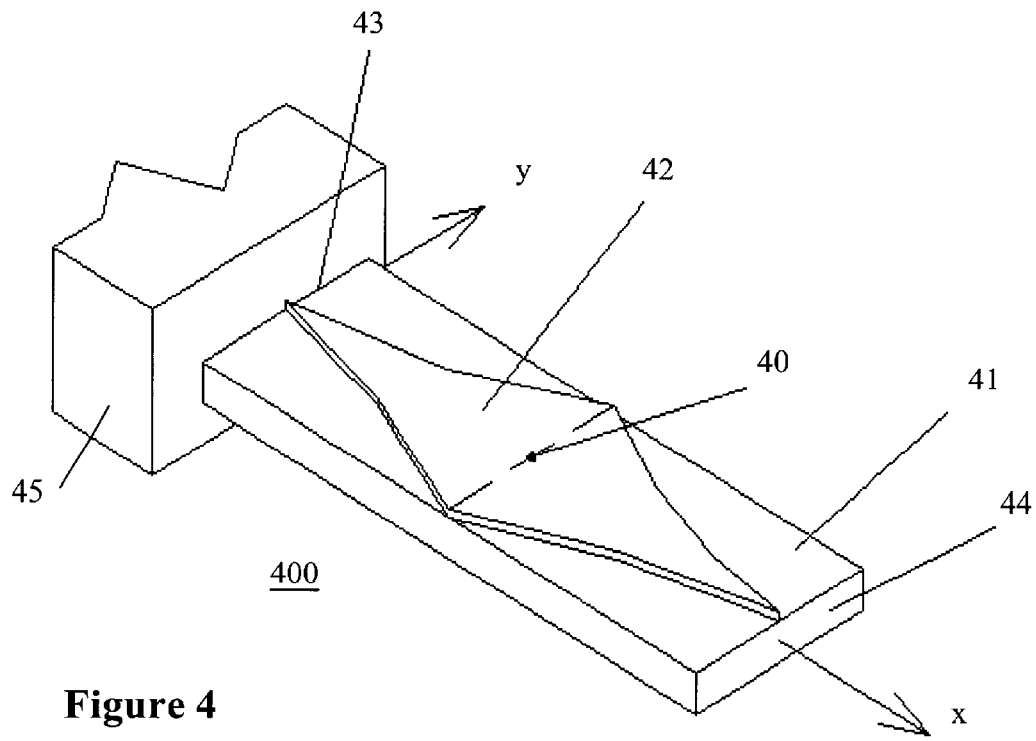
FIG. 4 is a perspective view outlining the selection of the target origin in an embodiment of the inventive piezoelectric transducer apparatus utilized as a vibration detector.

FIG. 4 is a perspective view outlining the selection of the target origin in an embodiment of the inventive piezoelectric transducer apparatus utilized as a vibration detector. In the sensor construction 400 illustrated in the drawing for a piezoelectric transducer apparatus, the target origin 40 is set approximately to the center of the body structure 41 along the longitudinal axis x. The construction 400 has a free end 44 and a fixed end 43. As is comprehensible, the fixed end 43 of the body structure 41 is attached to a support base 45, and the free end 44 is left unsupported. Such a construction 400, equipped with an electrode 42 having the shape determined by the effective surface electrode ζ(x), is suitable for use as a piezoelectric sensor device that maintains its fixed phase even though the gain in the system is changed.

As the wave propagation in the body structure of a sensor construction reaches to the physical boundary, different scenarios of phase shift and/or energy consumption are possible as a result of different boundary conditions. Common boundary conditions are free and fixed boundaries. Fixed-free set of boundary condition arrangement is typical for piezoelectric sensor constructions. The concept of imaging in the study of wave motion in elastic solids is helpful in the design of piezoelectric sensor constructions. The employment of imaging concept assists in transferring the discussion of the system between the infinite and the finite domains.

Figure 5:
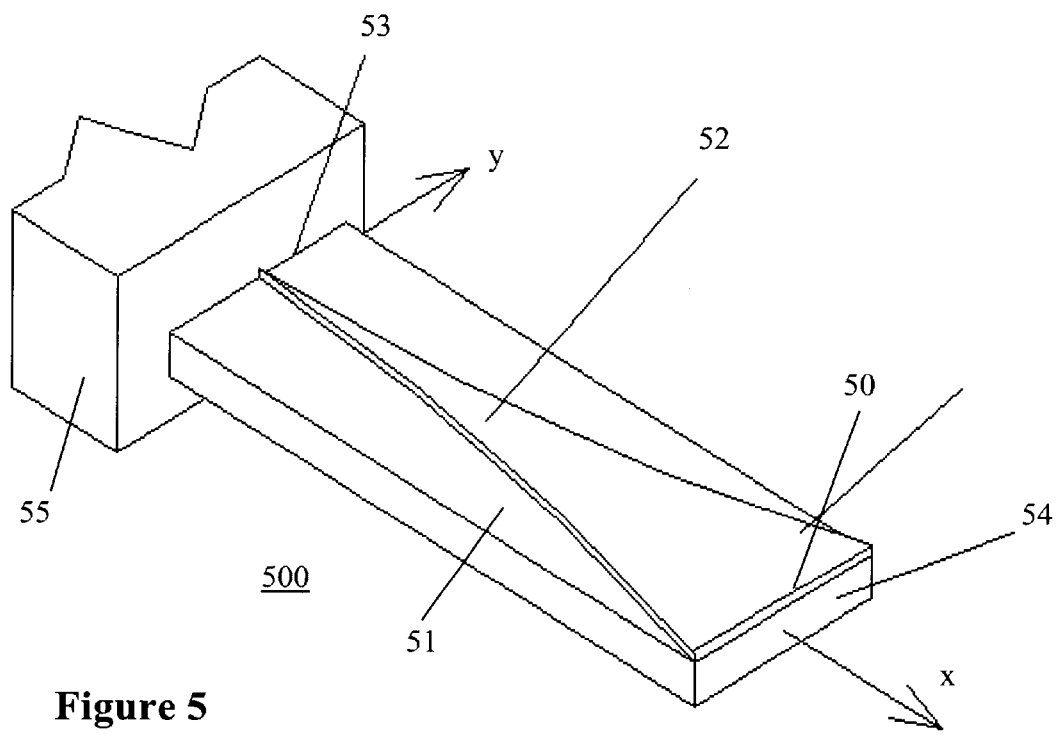
FIG. 5 is a perspective view illustrating the selection of the target origin at the free end of an embodiment of the inventive piezoelectric transducer apparatus utilized as a spatial filter.
Figure 6:
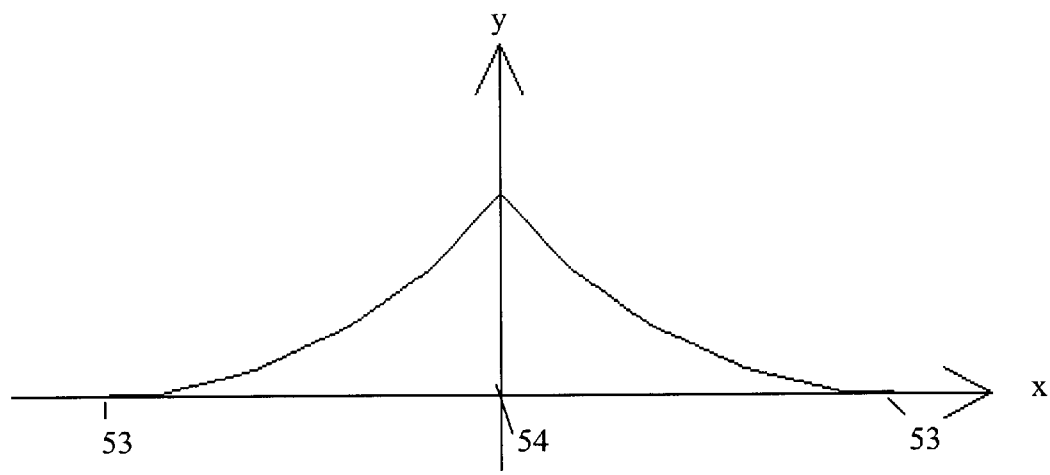
FIG. 6 shows the characteristic curve of the apparatus of FIG. 5 in the infinite domain that exhibits the characteristics of an even function.

FIG. 5 is a perspective view illustrating the selection of the target origin at the free end of an embodiment of the inventive piezoelectric transducer apparatus utilized as a spatial filter. In the construction 500 having the effective surface electrode 52, the target origin 50 is set to the free end 54 of the body structure 51. In this construction, a spatial filter has a characteristics of an even function shown in FIG. 6 as envisaged in the infinite domain. FIG. 6 shows the characteristic curve of the apparatus of FIG. 5 in the infinite domain that exhibits the characteristics of an even function.

Figure 7:
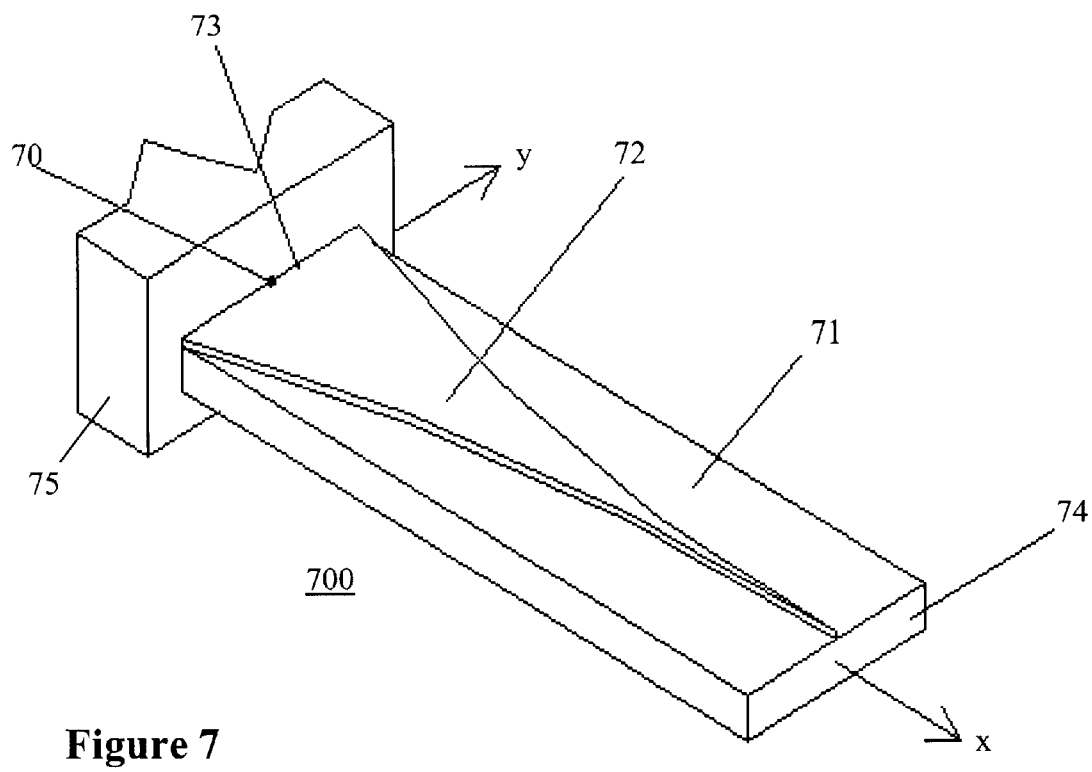
FIG. 7 is a perspective view illustrating an embodiment of the inventive piezoelectric transducer apparatus utilized as a spatial filter having the target origin selected at the fixed end that exhibits the characteristics of an odd function.
Figure 8:
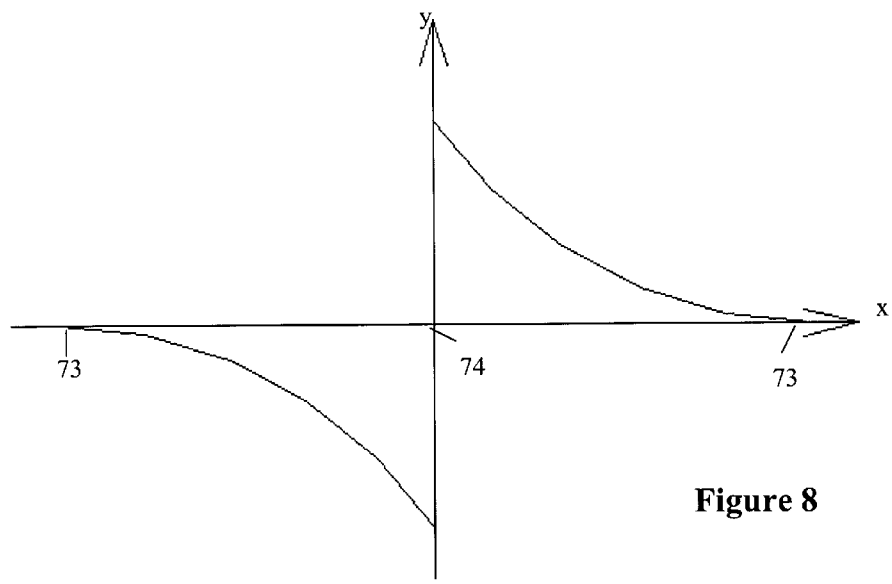
FIG. 8 shows the characteristic curve of the apparatus of FIG. 7 in the infinite domain that exhibits the characteristics of an odd function.

Similarly, FIG. 7 is a perspective view illustrating an embodiment of the inventive piezoelectric transducer apparatus utilized as a spatial filter having the target origin selected at the fixed end that exhibits the characteristics of an odd function. A spatial filter envisaged in the infinite domain in this construction 700 has a characteristics of an odd function shown in FIG. 8.

Figure 9:
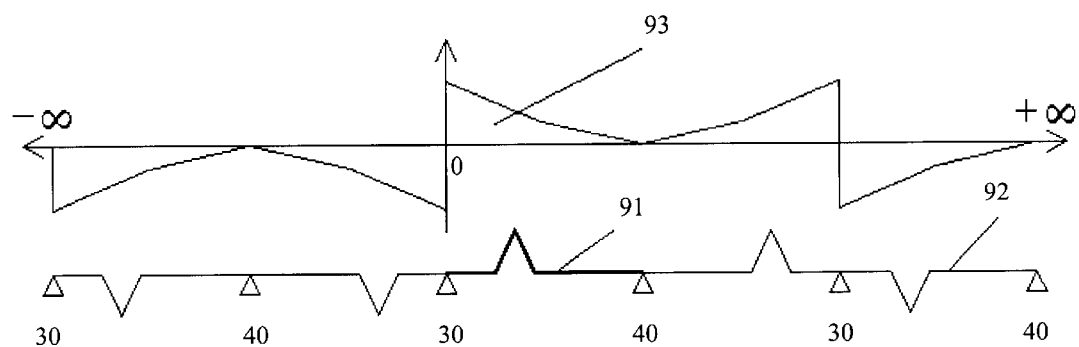
FIG. 9 shows the characteristic curve of an embodiment of the inventive piezoelectric transducer apparatus utilized as a spatial filter in the infinite domain and having the target origin selected at the fixed end.

Thus, the concept of imaging can be employed to manipulate different boundary condition arrangements in the design of the inventive piezoelectric transducer apparatus. The substantial body structure of a sensor construction in the finite domain may be transformed into the infinite domain for mathematical modeling and analysis. Wave propagation can be considered in the analysis as being in the infinite domain instead of the finite one of the real world. FIG. 9 shows the characteristic curve of an embodiment of the inventive piezoelectric transducer apparatus utilized as a spatial filter in the infinite domain and having the target origin selected at the fixed end.

In FIG. 9, the coarse section 91 represents an example of the wave propagation in the body structure, the entire fine section 92 extending in both the positive and negative directions at the free end 40 and the fixed end 30 respectively, represents the finite domain in which the sensor body structure resides. Curve 93 correspondingly represents the characteristics of the construction in terms of wave propagation as envisaged in the infinite domain transformed from the finite domain 92 by applying imaging. The characteristics clearly shows itself as an odd-function characteristics in the infinite domain.

Figure 10:
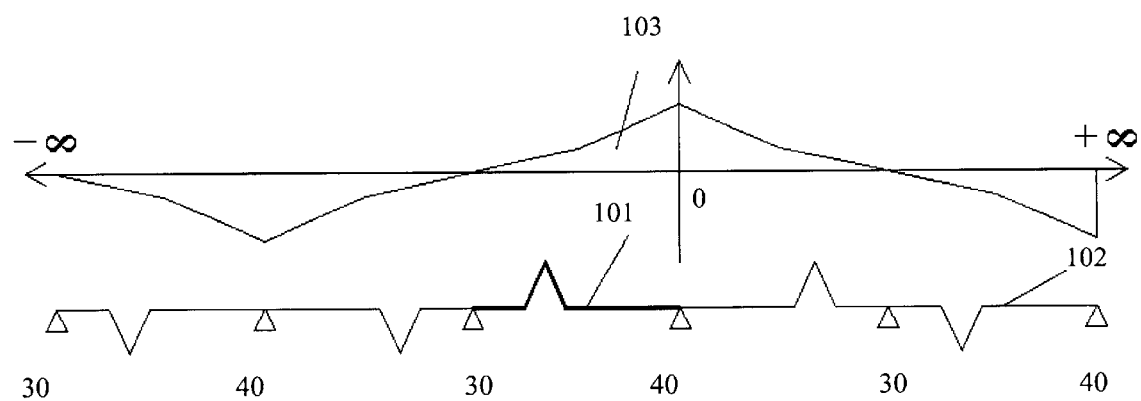
FIG. 10 shows the characteristic curve of an embodiment of the inventive piezoelectric transducer apparatus utilized as a spatial filter in the infinite domain and having the target origin selected at the free end.

By contrast, FIG. 10 shows the characteristic curve of an embodiment of the inventive piezoelectric transducer apparatus utilized as a spatial filter in the infinite domain and having the target origin selected at the free end. Characteristics curve 103 identifies that the piezoelectric construction exhibits an even-function characteristics of a spatial filter having disengaged phase and gain characteristics.

As described, once the mathematical analysis of a finite domain piezoelectric construction is transformed into the infinite domain applying the technique of either window functioning or the manipulation of boundary condition arrangements, Laplace transform becomes a valuable tool of design. Basic considerations in a spatial filter are in relation to wave propagation. In a piezoelectric construction based on a body structure such as an Euler beam that conforms to a fourth-order system, the mathematical expression for the effective surface electrode $\zeta(x)$ in terms of the dimensional variable x can be shown to be resolved into exponential functions.

Wave propagation in these constructions are expressed as exponential functions of the natural logarithmic base. Therefore, whenever an effective surface electrode for the sensor units of these constructions is contoured into a shape conforming to a corresponding $\zeta(x)$ incorporating the base of exponential functions, the characteristics of the spatial filter built out of the construction can be effectively controlled. In other words, surface electrodes shaped in accordance with different exponential bases can be utilized to construct piezoelectric transducer apparatuses of different characteristics. Further, transducer apparatuses thus constructed have disengaged gain and phase characteristics.

Tables 1 and 2 below list a few possible bases suitable for use in the construction of the effective surface electrodes for the sensor units that are attached to the body structure of the inventive piezoelectric transducer apparatuses. Note that these base listings are for second order systems complying to those described in the governing equation (7). Table 1 lists bases for those constructions in which waves are in the x>0 direction. Table 2 lists bases for x<0. In the Tables, bases are lists in the left column. Right columns of both Tables outlines transfer function induced by the system adopting the corresponding base.

TABLE 1

Base in Spatial Filters, x > 0

| Base in System | Transfer Function Induced by the System |
|---|---|
| $e^{\alpha x}$ | $\dfrac{1}{s - \alpha}$ |
| $e^{-\alpha x}$ | $\dfrac{1}{s + \alpha}$ |
| $e^{j\alpha x}$ | $\dfrac{1}{s - j\alpha}$ |
| $e^{-j\alpha x}$ | $\dfrac{1}{s + j\alpha}$ |
| $e^{\alpha x} e^{j\alpha x}$ | $\dfrac{1}{s - (\alpha + j\alpha)}$ |
| $e^{-\alpha x} e^{-j\alpha x}$ | $\dfrac{1}{s + (\alpha + j\alpha)}$ |
| $e^{j\alpha x} - e^{-j\alpha x}$ | $\dfrac{2i}{s^2 + \alpha^2}$ |
| $e^{j\alpha x} + e^{-j\alpha x}$ | $\dfrac{2s}{s^2 + \alpha^2}$ |
| $\sin(\alpha x)$ | $\dfrac{\alpha}{s^2 + \alpha^2}$ |
| $\cos(\alpha x)$ | $\dfrac{s}{s^2 + \alpha^2}$ |

TABLE 1-continued

Base in Spatial Filters, x > 0

| Base in System | Transfer Function Induced by the System |
|---|---|
| $\sinh(\alpha x)$ | $\dfrac{\alpha}{s^2 - \alpha^2}$ |
| $\cosh(\alpha x)$ | $\dfrac{s}{s^2 - \alpha^2}$ |
| $e^{-\alpha x}\sin(\beta x)$ | $\dfrac{\beta}{(s + \alpha)^2 + \beta^2}$ |
| $e^{-\alpha x}\cos(\beta x)$ | $\dfrac{(s + \alpha)}{(s + \alpha)^2 + \beta^2}$ |
| $x^n e^{\alpha x}$ | $\dfrac{n!}{(s - \alpha)^{n+1}}$ |
| $e^{-\alpha x}\sinh(\beta x)$ | $\dfrac{\beta}{((\alpha + s) - \beta)((\alpha + s) + \beta)}$ |
| $e^{-\alpha x}\cosh(\beta x)$ | $\dfrac{\alpha + s}{((\alpha + s) - \beta)((\alpha + s) + \beta)}$ |

TABLE 2

Base in Spatial Filters, x < 0

| Base in System | Transfer Function Induced by the System |
|---|---|
| $e^{\alpha x}$ | $\dfrac{1}{\alpha - s}$ |
| $e^{-\alpha x}$ | $-\dfrac{1}{\alpha + s}$ |
| $e^{j\alpha x}$ | $\dfrac{1}{j\alpha - s}$ |
| $e^{-j\alpha x}$ | $-\dfrac{1}{j\alpha + s}$ |
| $e^{\alpha x} e^{j\alpha x}$ | $\dfrac{1}{(\alpha + j\alpha) - s}$ |
| $e^{-\alpha x} e^{-j\alpha x}$ | $\dfrac{1}{(\alpha + j\alpha) + s}$ |
| $e^{j\alpha x} - e^{-j\alpha x}$ | $-\dfrac{2i\alpha}{s^2 + \alpha^2}$ |
| $e^{j\alpha x} + e^{-j\alpha x}$ | $-\dfrac{2s}{s^2 + \alpha^2}$ |
| $\sin(\alpha x)$ | $-\dfrac{\alpha}{s^2 + \alpha^2}$ |
| $\cos(\alpha x)$ | $-\dfrac{s}{s^2 + \alpha^2}$ |
| $\sinh(\alpha x)$ | $-\dfrac{\alpha}{s^2 - \alpha^2}$ |
| $\cosh(\alpha x)$ | $-\dfrac{s}{s^2 - \alpha^2}$ |

TABLE 2-continued

Base in Spatial Filters, x < 0

| Base in System | Transfer Function Induced by the System |
|---|---|
| $e^{-\alpha x}\sin(\beta x)$ | $-\dfrac{\beta}{(\alpha+s)^2+\beta^2}$ |
| $e^{-\alpha x}\cos(\beta x)$ | $\dfrac{(\alpha+s)}{(\alpha+s)^2+\beta^2}$ |
| $|x|^n e^{\alpha x}$ | $\dfrac{n!}{(s+\alpha)^{n+1}}$ |
| $e^{-\alpha x}\sinh(\beta x)$ | $-\dfrac{\beta}{((\alpha+s)-\beta)((\alpha+s)+\beta)}$ |
| $e^{-\alpha x}\cosh(\beta x)$ | $-\dfrac{\alpha+s}{((\alpha+s)-\beta)((\alpha+s)+\beta)}$ |

If the body structure of a piezoelectric construction is mathematically divided into left (x<0) and right (x>0) sections with respect to the target of origin chosen for the system, then, as Tables 1 and 2 clearly show, the Laplace transform applied to the left and right sections of the body structure in fact induced transfer functions that cancel each other. This is because that the transfer functions for the two sections have the same amplitude but are out of phase spontaneously. Specifically, if the instantaneous phase in a system at one side of its targeted origin (x>0) is a, then the corresponding phase at the opposite side (x<0) is automatically −a. Spatial filters in accordance with the present invention thus do not really escape the rules of a causal system but, in fact, result into signals in the opposite directions with respect to the target origin having reversed phases. This is the cause for the desirable characteristics of the piezoelectric transducer apparatus of the present invention that the phase characteristics is totally disengaged from the status of the gain.

Piezoelectric transducer apparatus according to the present invention also exhibits a characteristics of superposition. Spatial filters can be constructed by linear superposition in the spatial domain. In other words, the surface electrode of the sensor unit of a piezoelectric construction can be designed to be the superposition of more than one known spatial filter functions, whose functional characteristics are known. The only issue to concern is that the superposition result of all these candidate functions needs to be able to be defined in the infinite domain.

Figure 11:
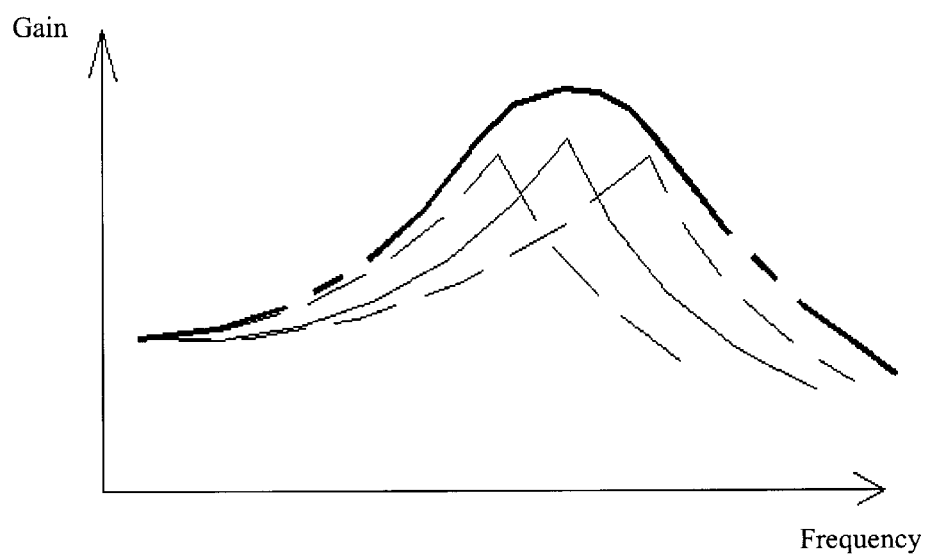
FIG. 11 shows the gain characteristics as a function of frequency for a band-pass filter constructed by the superposition of discrete spatial filters.

Based on the above, different band-pass filters can be constructed utilizing the piezoelectric transducer apparatus of the present invention. FIG. 11 shows the gain characteristics as a function of frequency for a band-pass filter constructed by the superposition of discrete spatial filters. The band-pass filter built utilizing the concept of functional superposition may thus enjoy an expanded filtering band than the discrete filters. This effectively broadens the pass band, as is illustrated in FIG. 12A.

Figure 12A:
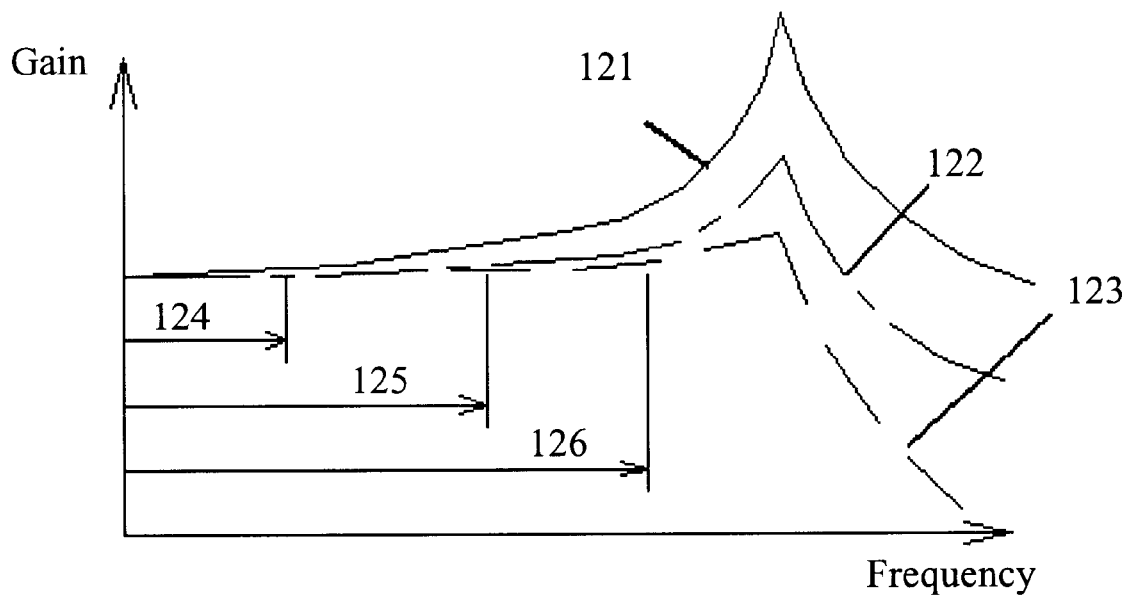
FIGS. 12A and 12B respectively show the gain and phase characteristics as functions of frequency for a low-pass filter that exhibit extended effective frequency range.
Figure 12B:
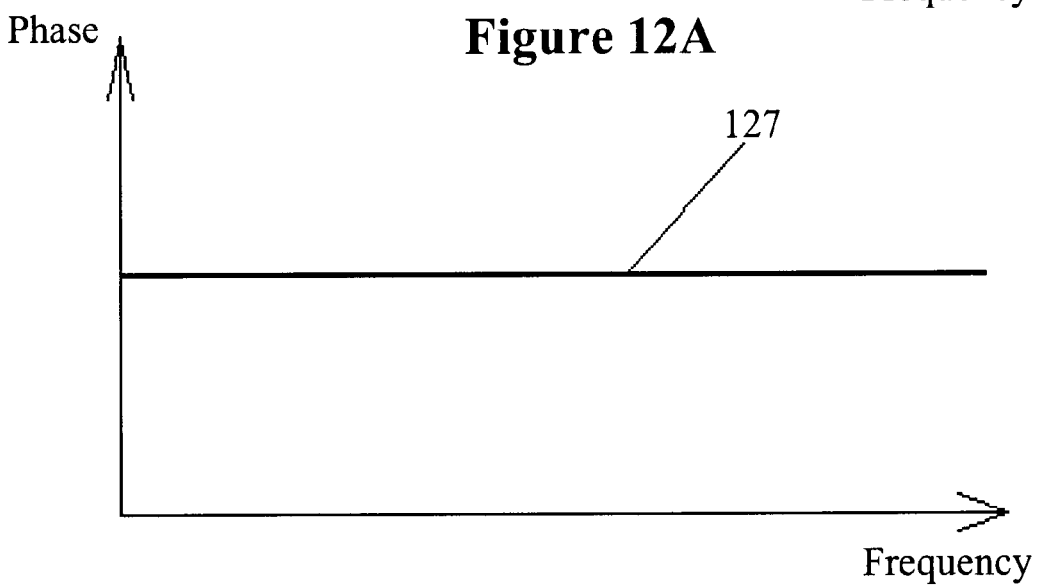

FIGS. 12A and 12B respectively show the gain and phase characteristics as functions of frequency for a low-pass filter that exhibit increased effective frequency range. Reference numerals 124, 125 and 126 in FIG. 12A represent the useful bandwidth achieved by the original system 121, achieved after the first-order filtering 122, and after the second-order filtering 123 respectively. The substantially constant phase value represented by curve 127 in FIG. 12B indicates the fact that the superposition to construct a low-pass filter does not alter the phase characteristics of the system.

Figure 13:
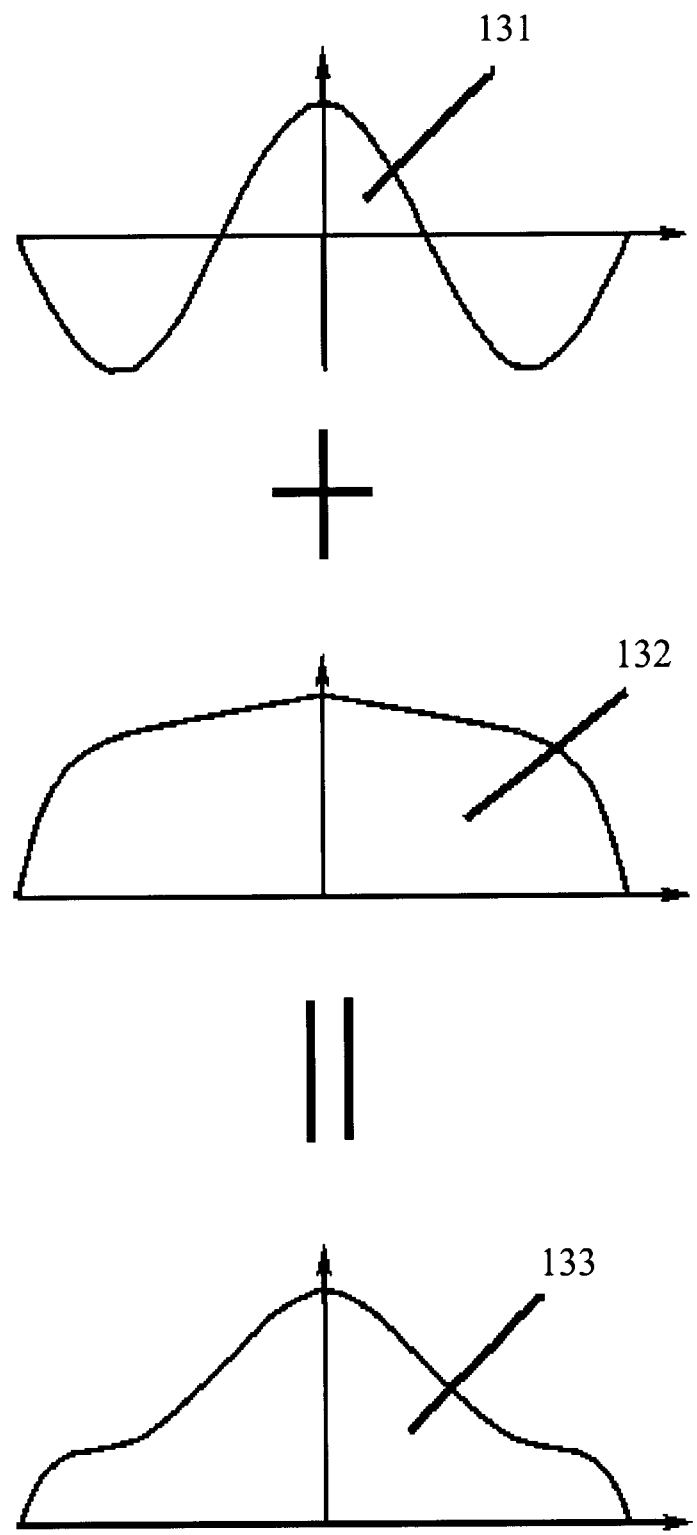
FIG. 13 schematically illustrates the superposition of discrete spatial filters involving no change in the direction of polarization for the design of the inventive piezoelectric transducer apparatus.

Superpositioning assists in simplifying the manufacture of piezoelectric apparatuses. FIG. 13 schematically illustrates the superposition of discrete spatial filters involving no change in the direction of polarization for the design of the inventive piezoelectric transducer apparatus. The drawing schematically illustrates the superposition of the gain characteristics 131 of a first filter having the exponential bases $e^{jkx}$ and $e^{-jkx}$ and the gain 132 of a second filter with the exponential base $e^{-k|x|}$. The drawing schematically shows that the gains 131 and 132 are superpositioned into the resultant gain 133. The superposed gain 133 becomes an all-positive gain characteristics within the entire frequency range. This effectively simplifies the fabrication of the piezoelectric device as only a positive electrode is needed. It becomes unnecessary to prepare positive and negative electrodes, electrode of reversed polarization profiles, over the same surface of the piezoelectric workpiece. Fabrication cost for such piezoelectric devices becomes optimized.

In the design concept based on the theory of wave propagation, spatial filter with target origin set to the free end has an even function characteristics. If the target origin is set to the fixed end, the characteristics is an odd function. Thus, if the surface electrode of a piezoelectric construction contains trigonometric base of either the sine or cosine function, it is possible to automatically expand into a complete sine or cosine function in the infinite domain. This can be achieved if the cosine characteristics in the case of free-end target origin is an even function, and the sine characteristics in the case of fixed-end target origin is an odd function.

Figure 14A:
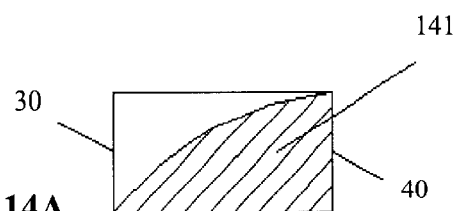
FIGS. 14A and 14B schematically illustrate the use of the method of imaging in the expansion of a sine function onto the infinite domain in the design of an inventive piezoelectric transducer apparatus based on a fixed-free cantilever beam structure.
Figure 14B:
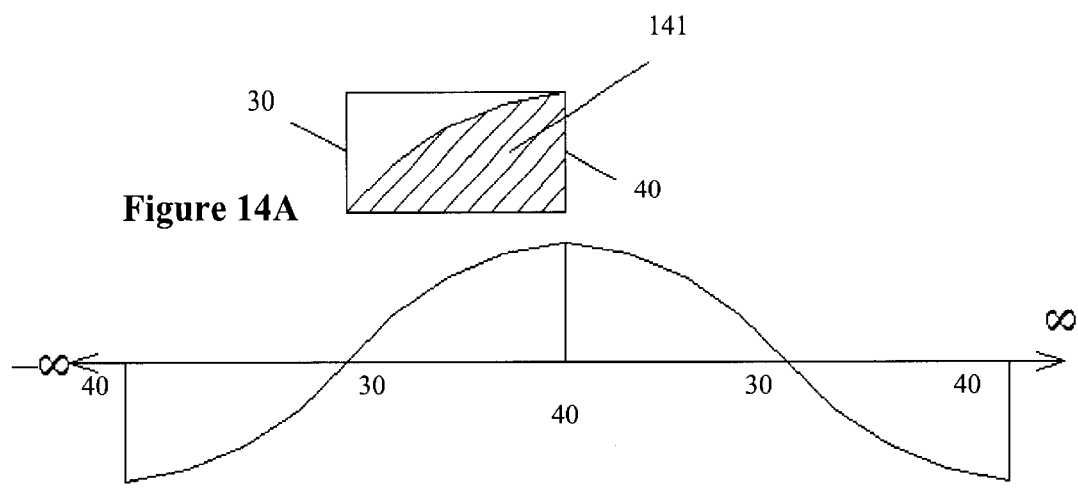

FIGS. 14A and 14B schematically illustrate the use of the method of image in the expansion of a sine function onto the infinite domain in the design of an inventive piezoelectric transducer apparatus based on a fixe-free body structure. In FIG. 14A, a piezoelectric construction based on a fixed-free body structure is schematically illustrated. The sine base of its electrode schematically represented by reference numeral 141 has the finite ¼ of a full sinusoidal cycle that can be transferred into the infinite domain by employing the imaging principle, combined with the arrangement that one end of the elongated body structure set as the fixed end 30 and the other as the free end 40. This is reflected in FIG. 14B in which the domain is infinite.

Figure 15A:
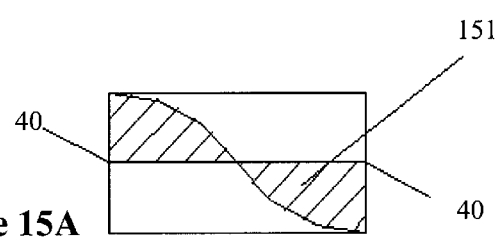
FIGS. 15A and 15B schematically illustrate the use of the method of imaging in the expansion of a sine function onto the infinite domain in the design of an inventive piezoelectric transducer apparatus based on a free-free cantilever beam structure.
Figure 15B:
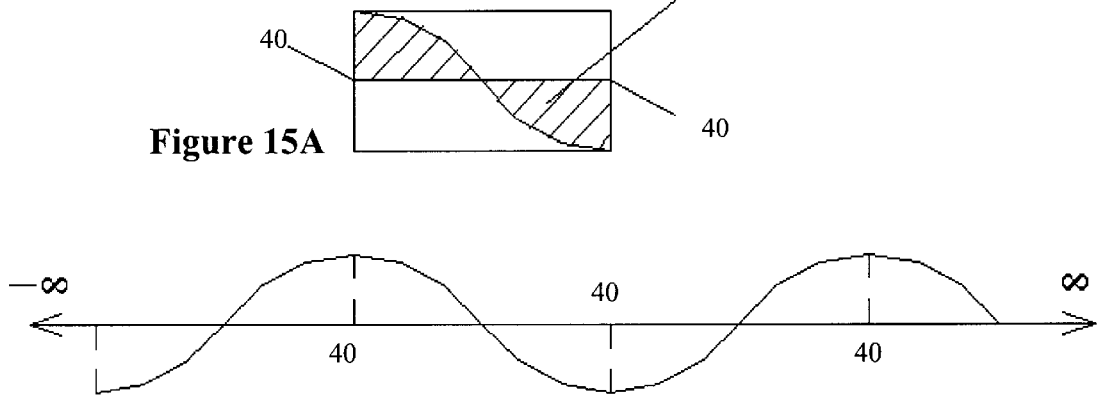
Figure 16A:
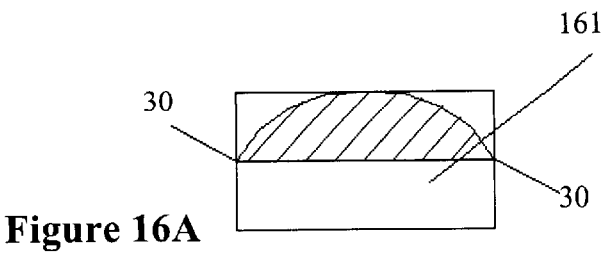
FIGS. 16A and 16B schematically illustrate the use of the method of imaging in the expansion of a sine function onto the infinite domain in the design of an inventive piezoelectric transducer apparatus based on a fixed-fixed cantilever beam structure.
Figure 16B:
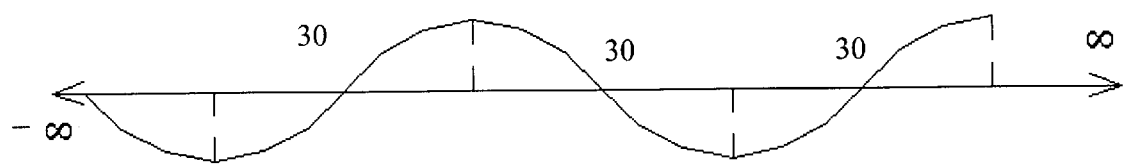

FIGS. 15A and 15B and FIGS. 16A and 16B illustrate two other similar designs respectively. FIGS. 15A and 15B schematically illustrate the use of the method of imaging in the expansion of a sine function onto the infinite domain in the design of an inventive piezoelectric transducer apparatus based on a free-free body structure. FIGS. 16A and 16B schematically illustrate the use of the method of imaging in the expansion of a sine function onto the infinite domain in the design of an inventive piezoelectric transducer apparatus based on a fixed-fixed body structure.

In addition to the low-pass filters made from the inventive piezoelectric transducer apparatus as described above, it is possible to implement high-pass, band-pass, band-reject and other types of filters. Except for the above-described methodologies, the construction of these filters require other additional design considerations including, for example, the integration of certain sensor interfacing circuits.

Figure 17:
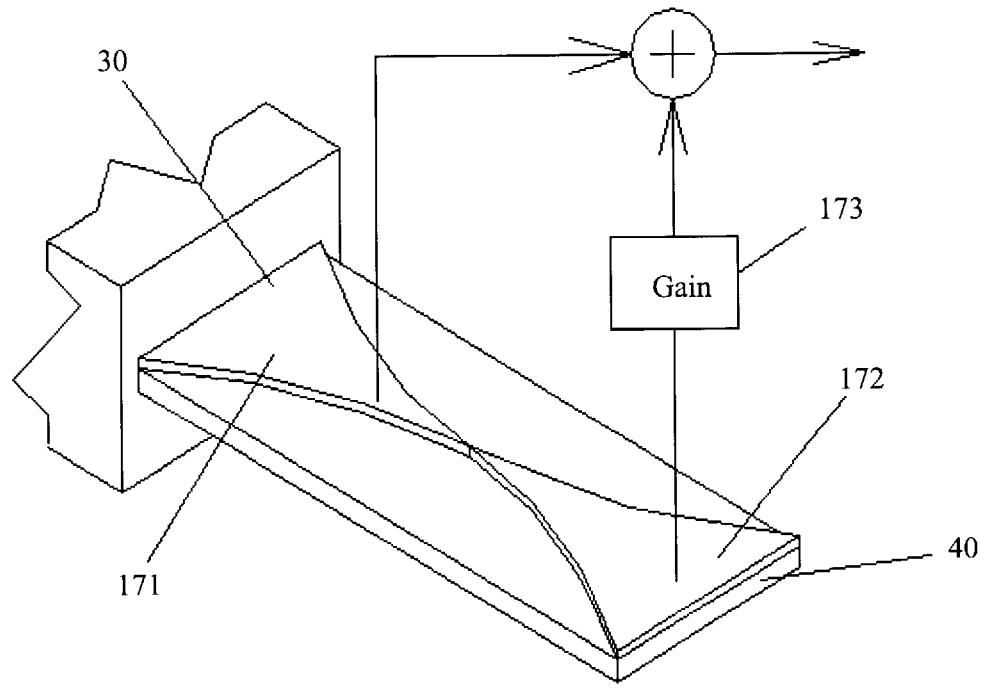
FIG. 17 is a perspective view illustrating an embodiment of a band-pass filter based on the inventive piezoelectric sensor apparatus having a fixed-free cantilever beam structure.

FIG. 17 is a perspective view illustrating an embodiment of a spatial filter based on the inventive piezoelectric sensor apparatus having a fixed-free body structure. In this piezoelectric construction, surface electrode 171 of a sensor unit attached to the body structure, which functions as a spatial filter, sets its target origin at the fixed end 30 of the system. Within the same construction, another surface electrode 172 of another sensor unit also adhered to the body structure and functions as another spatial filter sets its target origin at the free end 40 of the same system. Signals from both electrodes 171 and 172 can be picked up and summed up together in order to directly provide a zero in the entire system. Relative gain factors of both systems (of electrodes 171 and 172 respectively) can be adjusted by controlling the operation of the gain circuit 173, or by tailoring the shape and size of the surface electrodes themselves. As a result, a band-pass filter construction exhibiting the gain characteristics such as described in FIGS. 18A and 18B can be built.

Figure 18A:
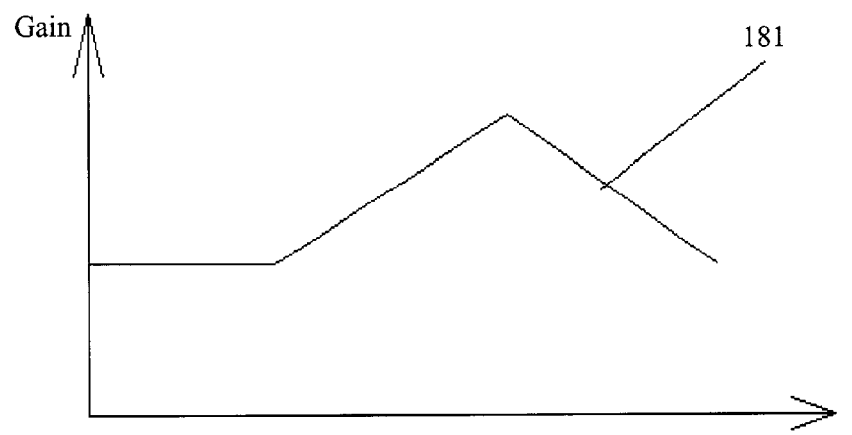
FIGS. 18A and 18B respectively show the gain and phase characteristics as functions of frequency for an embodiment of a band-pass filter based on the inventive piezoelectric sensor apparatus having a fixed-free cantilever beam structure.
Figure 18B:
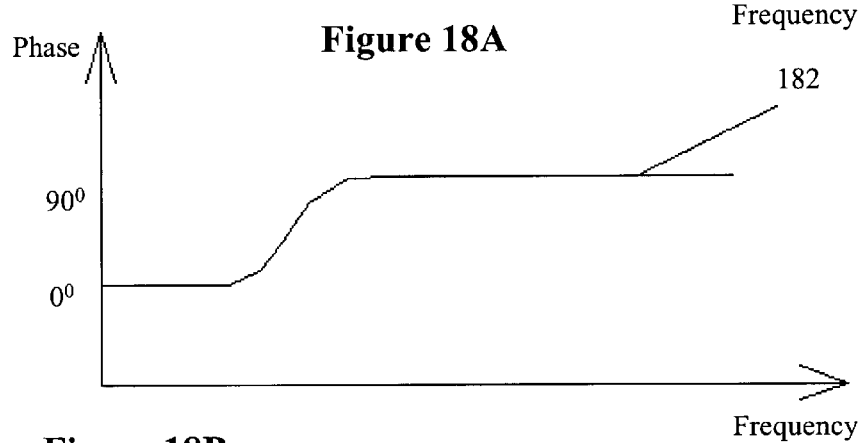

FIGS. 18A and 18B respectively show the gain and phase characteristics as functions of frequency for an embodiment of a band-pass filter based on the inventive piezoelectric sensor apparatus having a fixed-free body structure as described in FIG. 17. Gain characteristics 181 in FIG. 18A demonstrates the functionality of a band-pass filter. The phase characteristics 182 in FIG. 18B indicates that the phase remains virtually fixed regardless of the alteration of the gain within the same frequency range.

Figure 19:
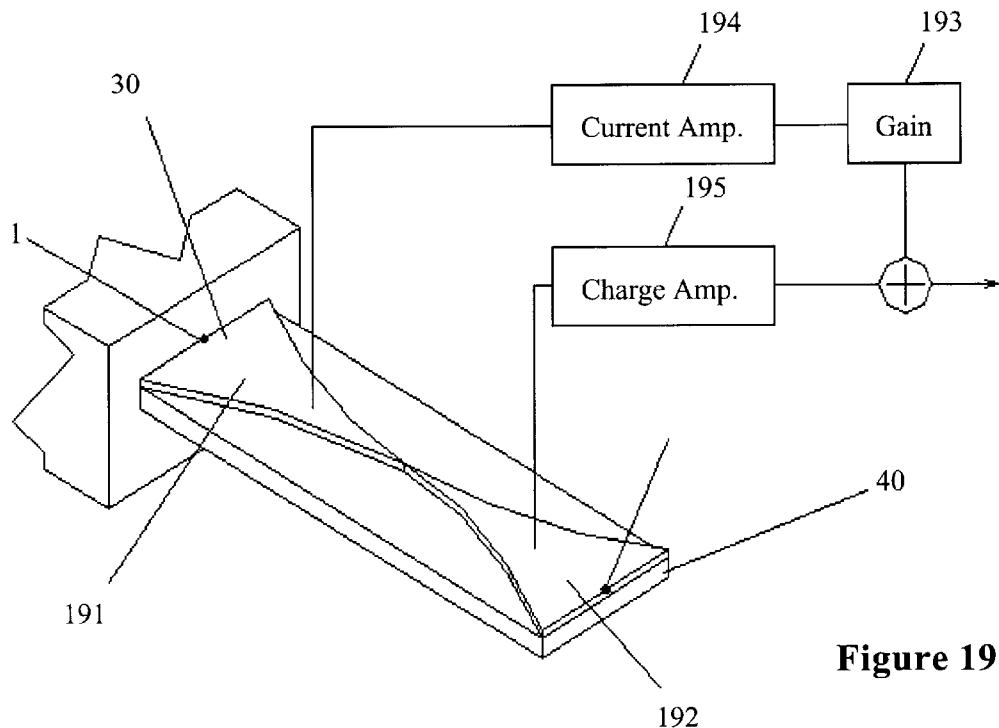
FIG. 19 is a perspective view illustrating an embodiment of a high-pass filter based on the inventive piezoelectric sensor apparatus having a fixed-free cantilever beam structure.

For the construction of a high-pass filter, the one illustrated in FIG. 19 for example, a piezoelectric construction similar to that of FIG. 17 is used. The difference rests in the fact that the interface circuit is integrated differently. The signal picked up at the fixed end 30 of the body structure via the electrode 191 is fed to a current amplifier 194. The first filter is one setting its target origin at the fixed end 30 of the body structure. A charge amplifier 195 is connected to the electrode 192 for the spatial filter setting its target origin at the free end 40 of the body structure. Relative gains for the first and second embedded filters are summed up, and the resultant signal as summed up exhibits the characteristics of a high-pass filter such as the one depicted in FIGS. 20A and 20B.

The above-described embodiments of the constructions for the inventive piezoelectric transducer apparatus employed designs that set their target origins at the symmetrical center location and the boundary locations that provide substantial symmetry for the entire construction. This arrangement secures symmetry of the effective surface electrodes separated by the target origin. This is an advantageous practice for flexible control of the characteristics of the filter thus constructed.

However, in case that the target origin is not set for symmetry, the section corresponding to the asymmetric portion of the system has to be added back. In other words, the missing sections less the symmetry of the system are returned back to the system by patching the corresponding electrode surface areas back to the body structure. This effectively brings the lost signal (not picked up by the electrode) back into the system, so that the physical finite domain can be transferred into the mathematical infinite domain.

Figure 22:
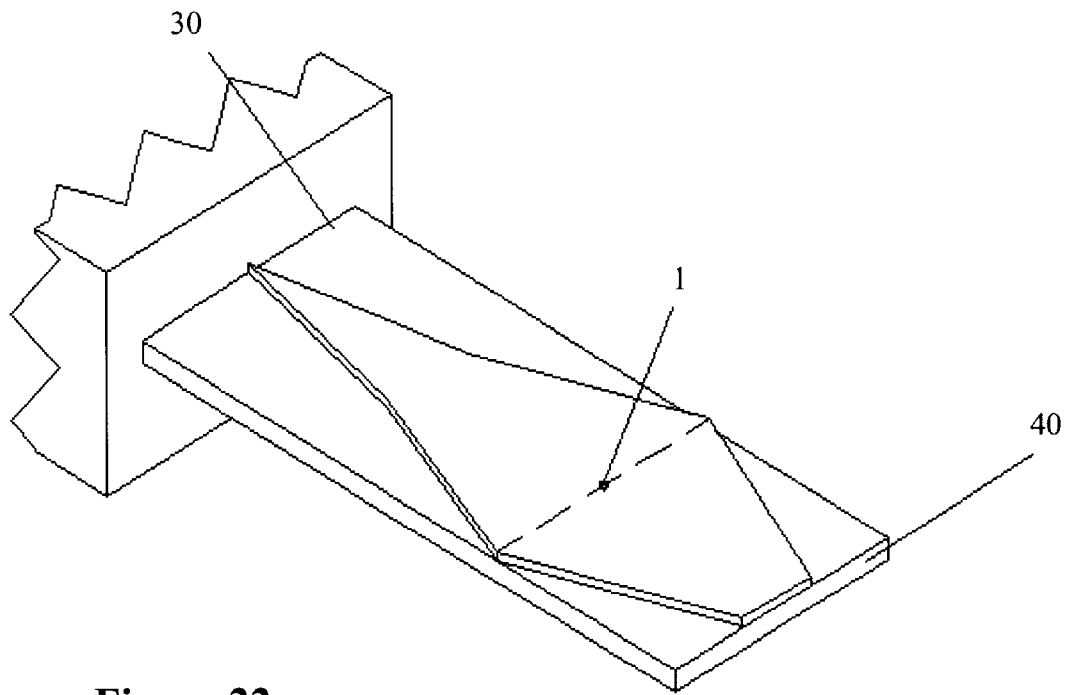
FIG. 22 is a perspective view illustrating another electrode design of an asymmetric effective surface having a target origin that is neither located at the body structural center nor at the body structural boundary.
Figure 23:
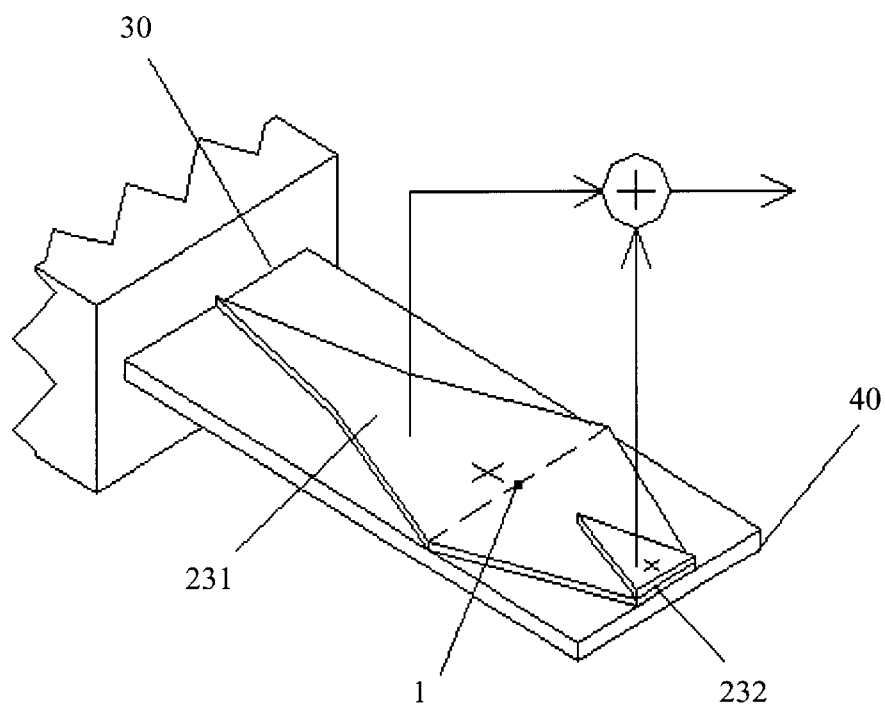
FIG. 23 is a perspective view illustrating the asymmetric effective surface electrode of an embodiment of the inventive piezoelectric transducer apparatus designed by superposition of discrete effective surface electrodes, with the fixed-free cantilever beam structure.

FIG. 21 is a perspective view illustrating the electrode design of an asymmetric effective surface having a target origin that is neither located at the body structural center nor at the body structural boundary. In the depicted example of FIG. 21, the target origin 1 is closer to the fixed end 30 of the body structure. Without the symmetry, wave propagation model can not be complete for the desired device functional characteristics. For the asymmetric selection of the target origin at the location closer to the free end of the body structure such as illustrated in FIG. 22, the missing section of the electrode at the free end can be patched back to the body structure so that the signal picked up becomes complete. FIG. 23 shows such a patched system.

FIG. 23 is a perspective view illustrating the asymmetric effective surface electrode of an embodiment of the inventive piezoelectric transducer apparatus designed by the superposition of discrete effective surface electrodes, with the fixed-free body structure. In the drawing, 231 represents a complete electrode for a first filter embedded in the system, and 232 represents a patched one.

Figure 24:
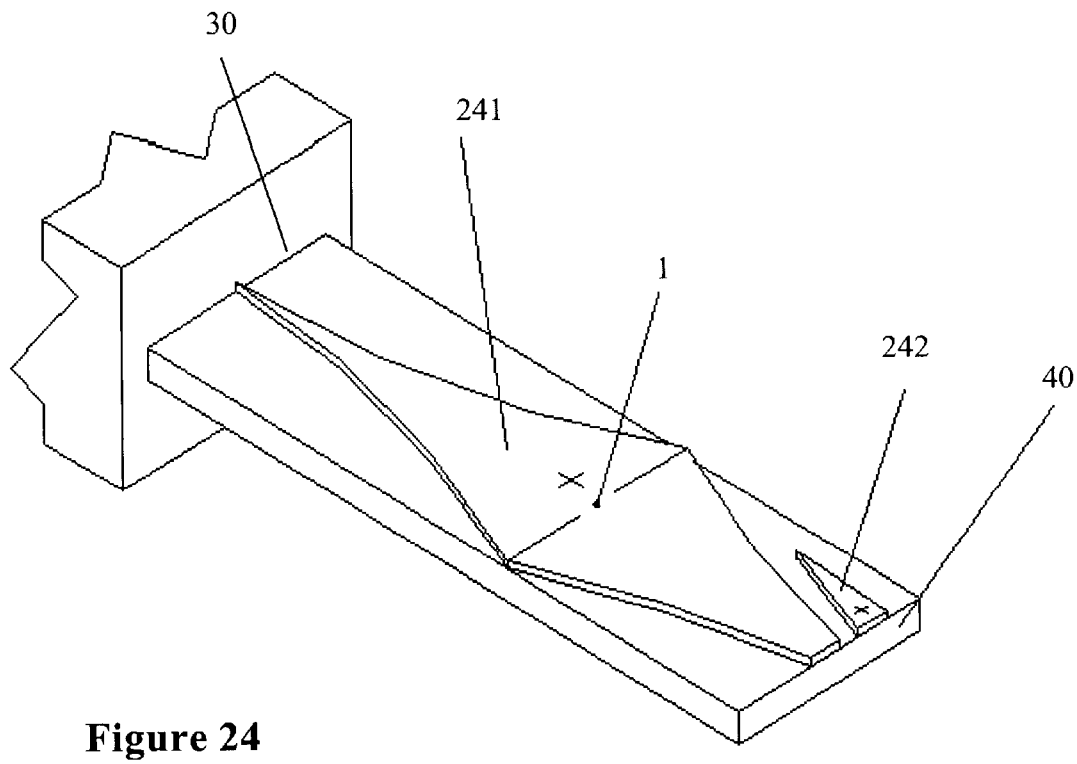
FIG. 24 is a perspective view illustrating another asymmetric effective surface electrode of an embodiment of the inventive piezoelectric transducer apparatus designed by superposition of discrete effective surface electrodes, with the target origin biased toward the free end of the fixed-free cantilever beam structure.
Figure 25:
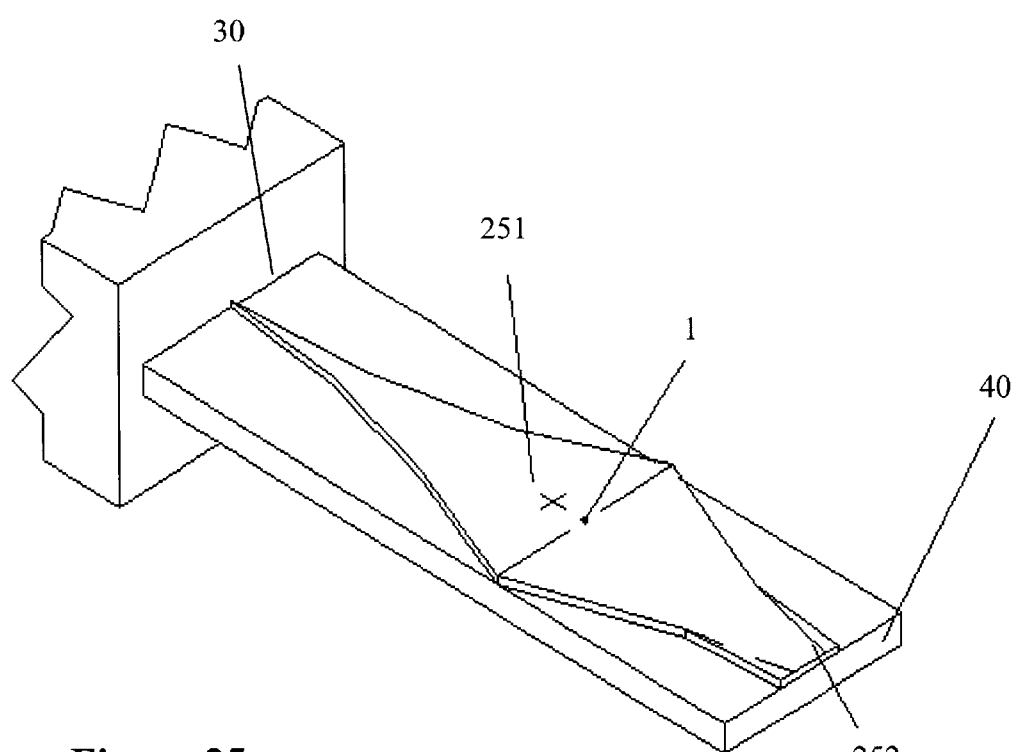
FIG. 25 is a perspective view illustrating yet another asymmetric effective surface electrode of an embodiment of the inventive piezoelectric transducer apparatus designed by superposition of discrete effective surface electrodes, with the target origin biased toward the free end of the fixed-free cantilever beam structure.

FIGS. 24 and 25 respectively illustrate alternate electrode patching designs for the asymmetric system of FIG. 22 as compared to the patching of FIGS. 23. Specifically, FIG. 24 is a perspective view illustrating another asymmetric effective surface electrode of an embodiment of the inventive piezoelectric transducer apparatus designed by the superposition of discrete effective surface electrodes, with the target origin biased toward the free end of the fixed-free body structure. FIG. 25 is a perspective view illustrating yet another asymmetric effective surface electrode of an embodiment of the inventive piezoelectric transducer apparatus designed by the superposition of discrete effective surface electrodes, with the target origin biased toward the free end of the fixed-free body structure.

In the case of FIG. 24, the missing section 242 of the electrode at the free end is placed back to the body structure. By contrast, in FIG. 25, the place back of the missing section of the electrode is different.

For patching of the surface electrode at the fixed end of the body structure, such as for the construction of FIG. 21, the implementation is different from that described in FIGS. 24 and 25. Since wave propagation at the fixed end of the body structure exhibits an odd function, therefore the patching for the missing section of the electrode must be subtractive. FIGS. 26–29 respectively illustrate how this can be implemented in various ways. In comparison, the patching in the case of FIGS. 24 and 25 are additive, as are label in the drawings by the same polarity signs of "+" as the main electrode section of those constructions.

Figure 26:
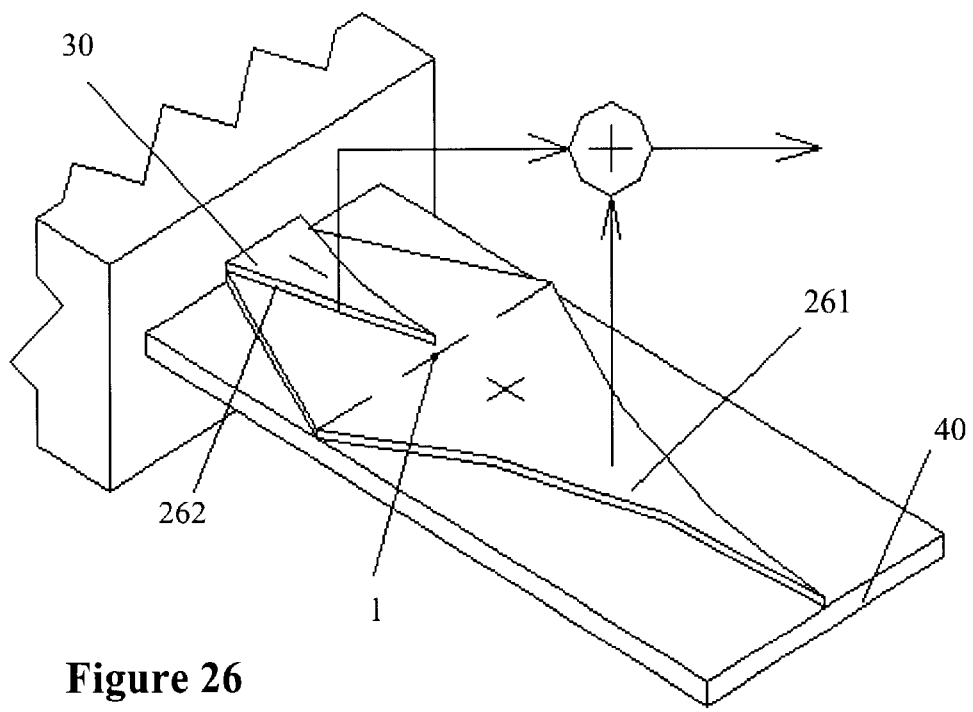
FIG. 26 is a perspective view illustrating the asymmetric effective surface electrode of an embodiment of the inventive piezoelectric transducer apparatus designed by superposition of discrete effective surface electrodes, with the target origin biased toward the fixed end of the fixed-free cantilever beam structure.

Specifically, FIG. 26 is a perspective view illustrating the asymmetric effective surface electrode of an embodiment of the inventive piezoelectric transducer apparatus designed by the superposition of discrete effective surface electrodes, with the target origin biased toward the fixed end of the fixed-free body structure.

Figure 27:
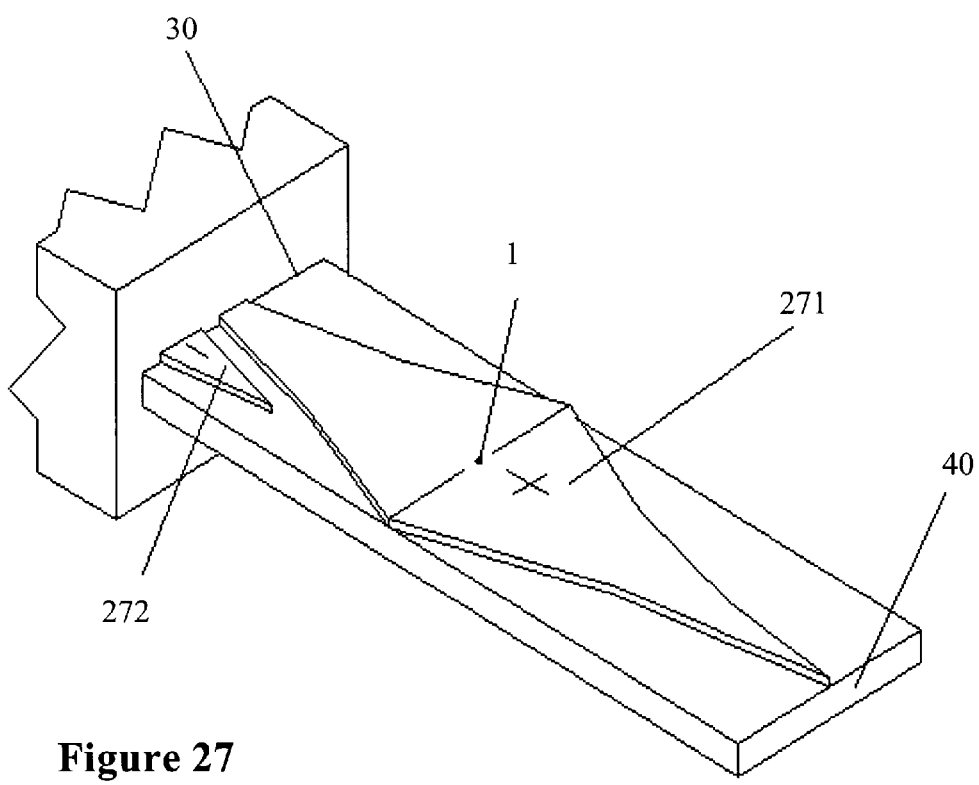
FIG. 27 is a perspective view illustrating another asymmetric effective surface electrode of an embodiment of the inventive piezoelectric transducer apparatus designed by superposition of discrete effective surface electrodes, with the target origin biased toward the fixed end of the fixed-free cantilever beam structure.

The perspective view of FIG. 27 illustrates another asymmetric effective surface electrode of an embodiment of the inventive piezoelectric transducer apparatus designed by the superposition of discrete effective surface electrodes, with the target origin biased toward the fixed end of the fixed-free body structure.

Figure 28:
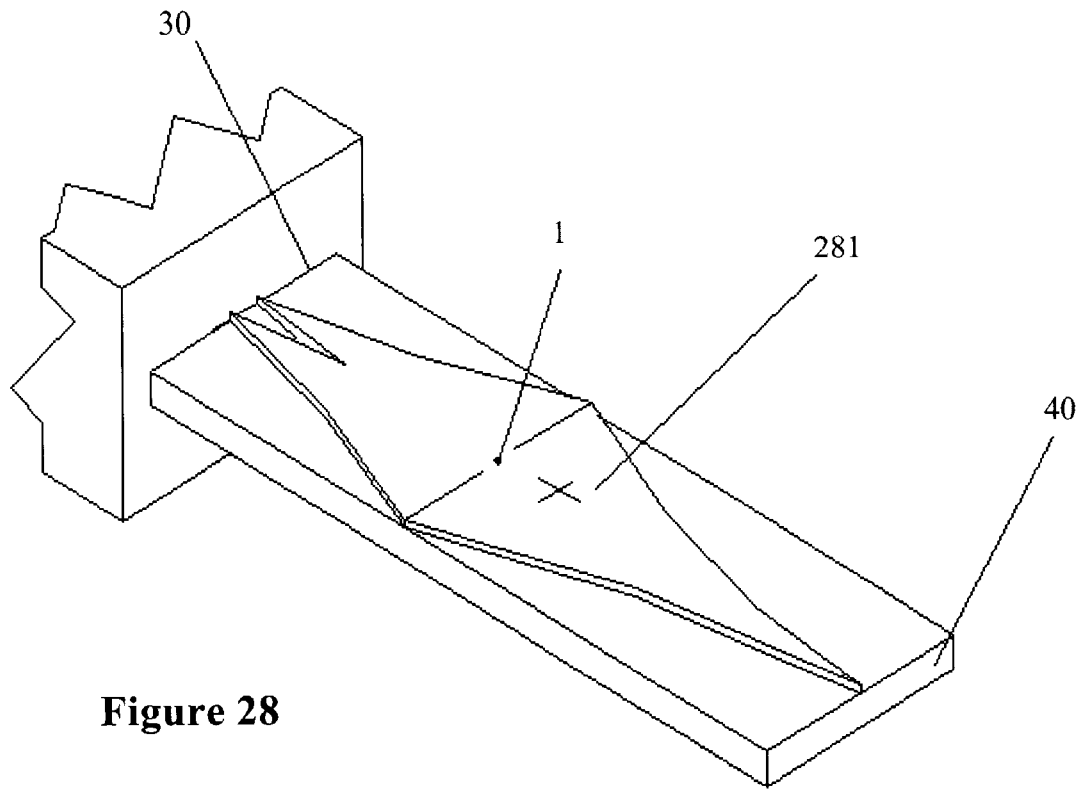
FIG. 28 is a perspective view illustrating yet another asymmetric effective surface electrode of an embodiment of the inventive piezoelectric transducer apparatus designed by superposition of discrete effective surface electrodes, with the target origin biased toward the fixed end of the fixed-free cantilever beam structure.

FIG. 28 is a perspective view illustrating yet another asymmetric effective surface electrode of an embodiment of the inventive piezoelectric transducer apparatus designed by the superposition of discrete effective surface electrodes, with the target origin biased toward the fixed end of the fixed-free body structure.

Figure 29:
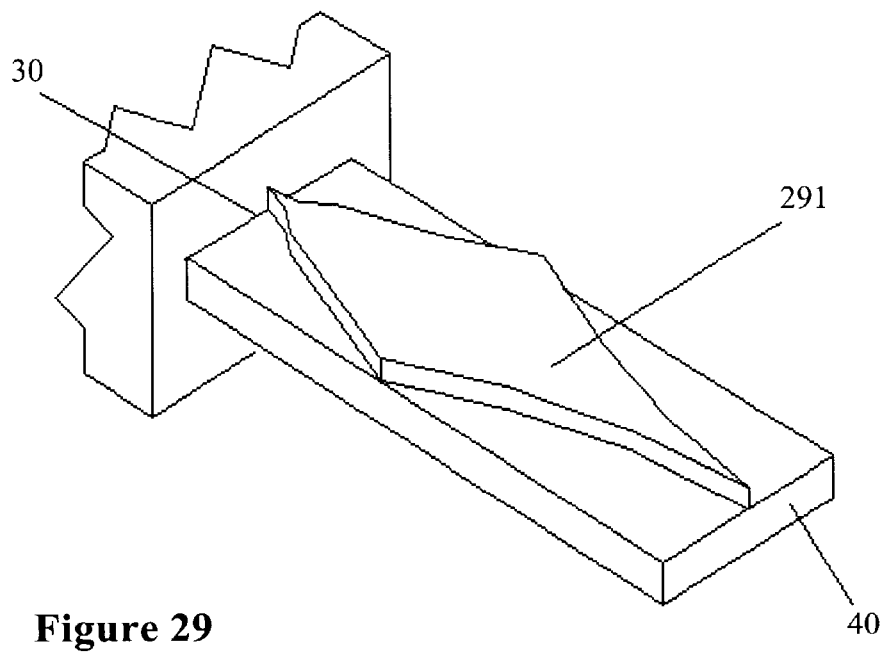
FIG. 29 is a perspective view illustrating still another asymmetric effective surface electrode of an embodiment of the inventive piezoelectric transducer apparatus designed by superposition of discrete effective surface electrodes, with the target origin biased toward the fixed end of the fixed-free cantilever beam structure.

FIG. 29 is a perspective view illustrating still another asymmetric effective surface electrode of an embodiment of the inventive piezoelectric transducer apparatus designed by the superposition of discrete effective surface electrodes, with the target origin biased toward the fixed end of the fixed-free body structure.

Figure 30:
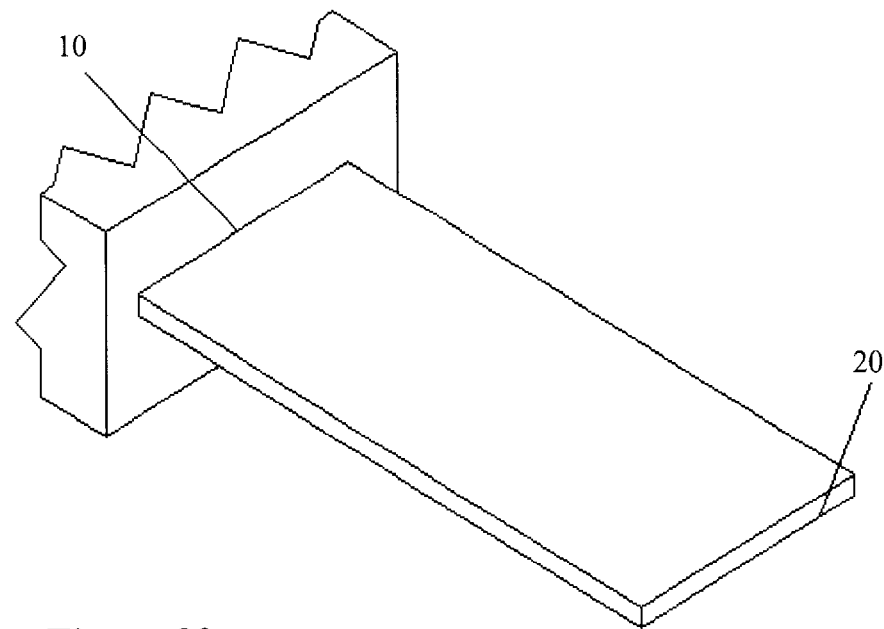
FIG. 30 is a perspective view illustrating an embodiment of the piezoelectric body structure having the boundary condition set neither to the fixed nor to the free end.

Under certain circumstances in which boundary condition at one or both boundaries of the body structure of a piezoelectric construction includes factors such as damping or spring elasticity substantially different from those discussed above in the fixed-free elongated body structure, design considerations become different. In these constructions, wave propagations reaching to these boundaries behave differently as both the phase and amplitude of the reflected waves become substantially altered with respect to those simple fixed-free structures discussed above. FIG. 30 is a perspective view schematically illustrating a piezoelectric sensor apparatus having the boundary condition set neither to the fixed nor to the free end.

Figure 31:
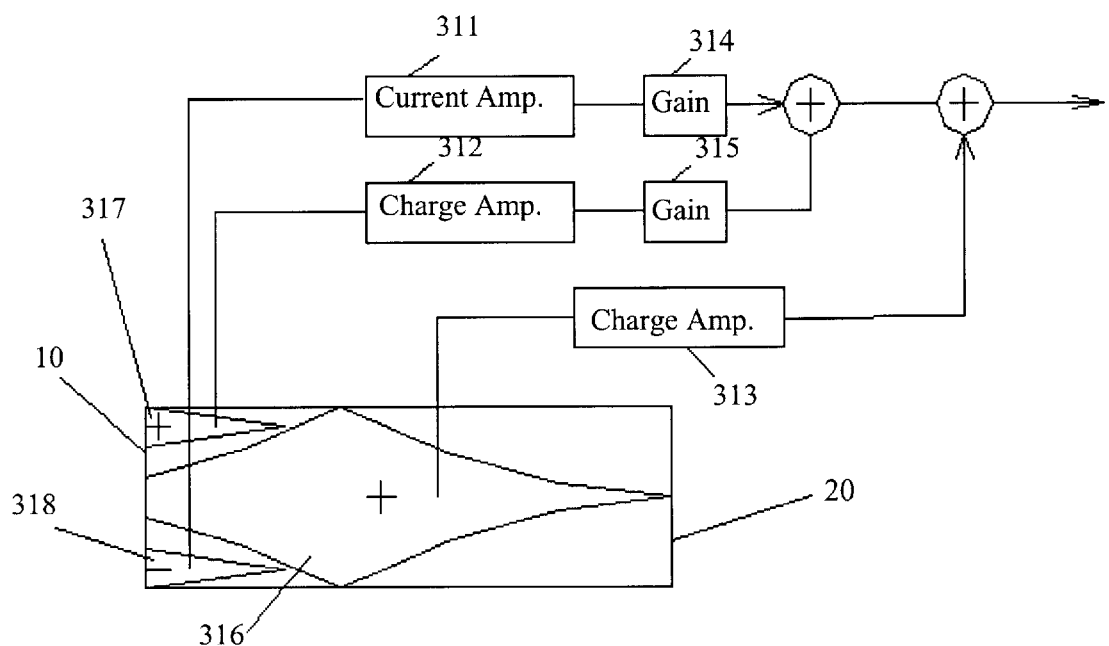
FIG. 31 is a schematic diagram illustrating the application of an embodiment of the inventive piezoelectric transducer apparatus in an inspection and test device by integration with an interface circuit and featuring a suitably-selected effective surface electrode with the boundary conditions neither fixed nor free end.

For piezoelectric constructions such as that of FIG. 30, interface circuits can be incorporated and integrated into the system in order to eliminate the adverse effects placed on the system by the weighting at the body structure boundary. FIG. 31 outlines such an interface circuit-augmented construction. FIG. 31 is a schematic diagram illustrating the application of an embodiment of the inventive piezoelectric transducer apparatus in an inspection and test device by integrating with an interface circuit and featuring a suitably-selected effective surface electrode.

Figure 32:
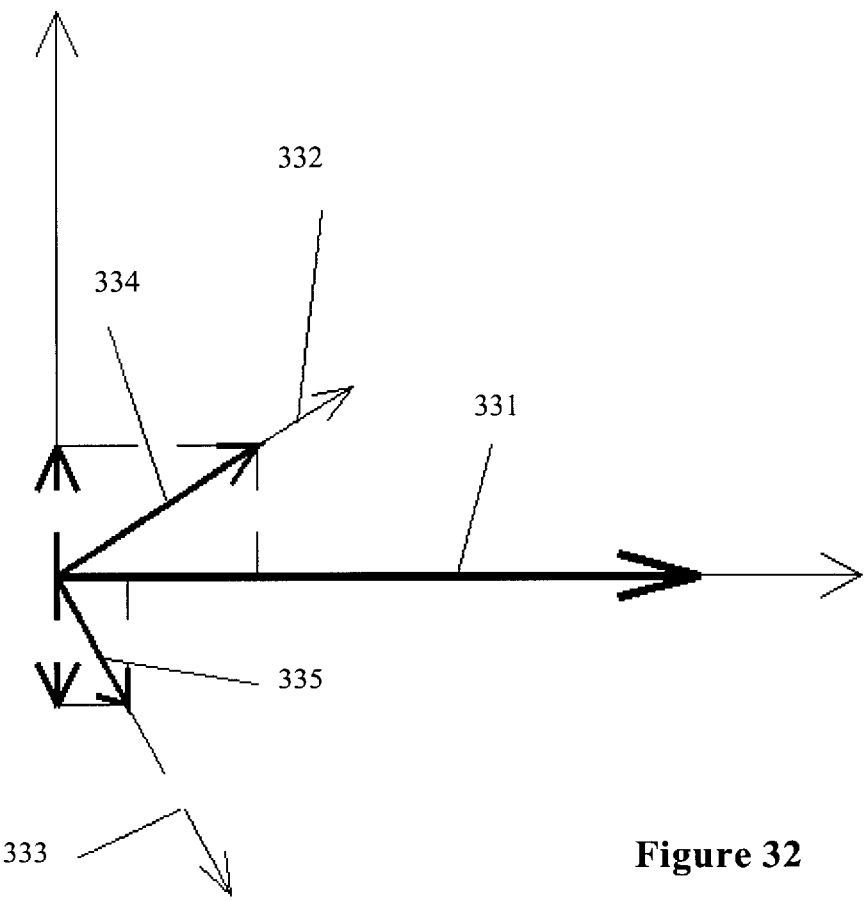
FIG. 32 illustrates the characteristics of the device of FIG. 31 in the complex plane.

In the drawing, a charge amplifier 313 is connected to the incomplete spatial filter surface electrode 316. Another charge amplifier 312 is connected to the patched electrode 317, and a current amplifier 311 is, in turn, connected to another patched electrode 318 of the reversed electrode polarity. Gains of current amplifier 311 and of charge amplifier 312 are further augmented by gain adjustment circuits 315 and 314 respectively. With this arrangement, the wave propagation in the entire system can still be transferred into the infinite domain. FIG. 32 illustrates the characteristics of the device of FIG. 31 in the complex plane.

Figure 33:
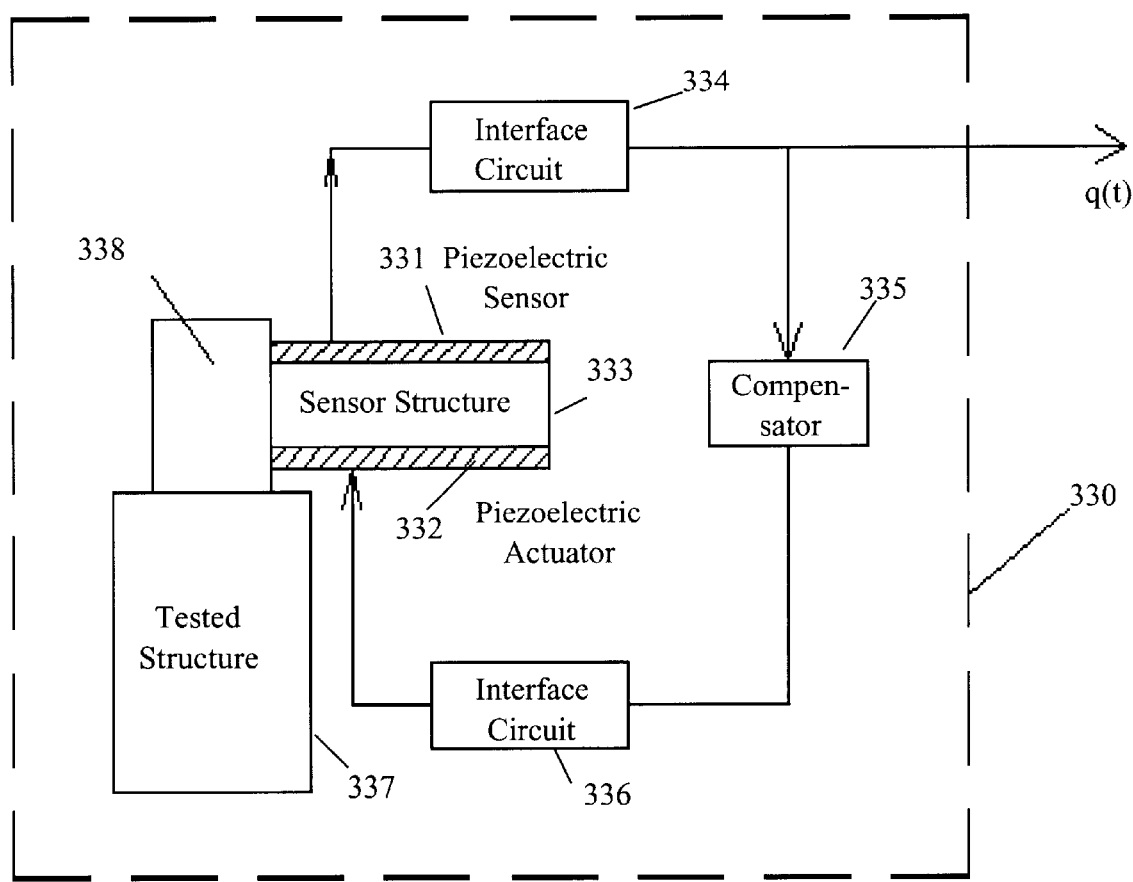
FIG. 33 is a block diagram illustrating the basic circuit configuration of a sense and control device having an active sensor feedback loop based on the bending effect of the piezoelectric body structure.

FIG. 33 is a block diagram illustrating the basic circuit configuration of a sense and control device having an active sensor feedback. The system of FIG. 33 is utilized for sense and control of vibrations in the target structure, the tested structure 337. The system of FIG. 33 features disengaged gain and phase characteristics since the piezoelectric construction employed in the system is constructed in accordance with the disclosure of the present invention.

In the system 330 of FIG. 33, as the inspected structure 337 receives vibration, sensor unit 331 of the sensor construction 338 picks up the vibration and generates the corresponding electric signal. The picked up signal is processed in the interface circuit 334 and the output q(t) also fed to the compensator 335 for feedback into the piezoelectric sensor construction 338. This can implemented as the output q(t) fetched to the compensator 335 is processed and the resulting compensation signal sent to the interface circuit 336 for feedback into the piezoelectric construction 338. Actuator unit 332 connected to interface circuit 336 is responsible for the fetch of the feedback into the construction. Such a close-loop feedback circuit configuration is thus able to implement active piezoelectric sensing.

Figure 34:
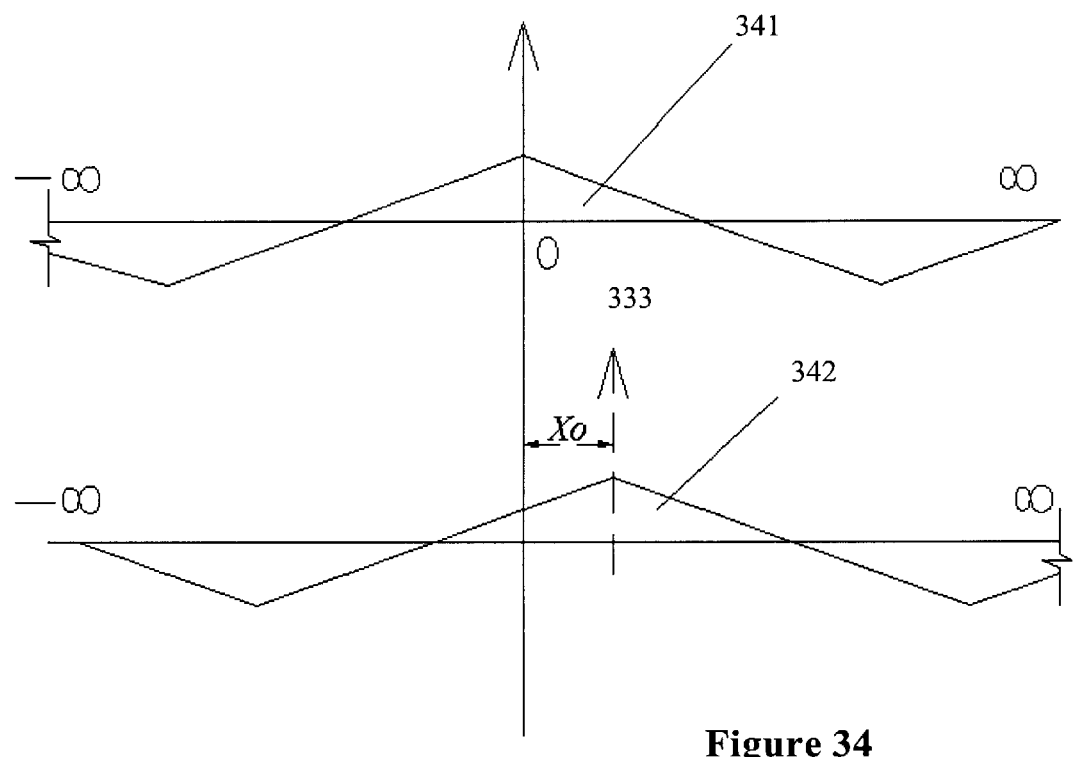
FIG. 34 illustrates the characteristics curve of an active inspection and test device in the infinite domain.

The piezoelectric system illustrated in FIG. 33 are constructed in accordance with the teaching of the present invention. They are different from those conventional system in that the phase characteristics is totally decoupled from the gain of the system. FIG. 34 illustrates the characteristics curve of the active system in the infinite domain.

While the above is a full description of the specific embodiments, various modifications, alternative constructions and equivalents may be used. For example, although piezoelectric transducer apparatuses with sensor constructions having the body structure in the form of Euler beams complying to fourth-order systems are utilized as examples for the mathematical development of the underlying principle of the present invention, use of body structures of other physical dimensions are possible. Further, piezoelectric transducer apparatuses mathematically other than a fourth-order system shape should not be construed as not being encompassed in the scope of the present invention. Therefore, the above description and illustrations should not be taken as limiting the scope of the present invention which is defined by the appended claims.

What is claimed is:

1. A piezoelectric transducer apparatus comprising:

at least one piezoelectric unit each having a piezoelectric block and at least one pair of electrodes, first electrode of said at least one pair of electrodes being adhered to a first surface of said piezoelectric block, and second electrode of said at least one pair of electrodes being adhered to a second surface of said piezoelectric block opposite to said first surface of said piezoelectric block; and a body structure, each of said at least one piezoelectric unit being adhered to the surface of said body structure with one of said at least one pair of electrodes exposed externally, wherein said apparatus having a generalized sensor equation which can be modeled in a fourth-order partial differential equation mathematical system, and at least one of said electrodes or said piezoelectric block of each of said at least one piezoelectric unit having a shape matched to a desired body strain pattern existing in said body structure wherein said electrode of each of said at least one piezoelectric unit exciting a strain pattern in said body structure that is the same as said desired body strain pattern.

2. A piezoelectric transducer apparatus comprising:

at least one piezoelectric unit each having a piezoelectric block, a first electrode and a second electrode having an electrode shape, said first electrode being adhered to a first surface of said piezoelectric block, and said second electrode being adhered to a second surface of said piezoelectric block opposite to said first surface of said piezoelectric block; and a body structure, each of said at least one piezoelectric unit being adhered to the surface of said body structure with said first electrode exposed externally, wherein said apparatus having a generalized sensor equation which can be modeled in a fourth-order partial differential equation mathematical system, and at least one of said electrodes or said piezoelectric block of each of said at least one piezoelectric unit having a shape matched to a desired body strain pattern existing in said body structure wherein said first electrode of each of said at least one piezoelectric unit exciting a strain pattern in said body structure that is the same as said desired body strain pattern.

3. The apparatus of claim 2, wherein said body structure is an Euler beam having an elongated one-dimensional body structure.

4. The apparatus of claim 3, wherein said strain pattern in said body structure is related to vibration traverse to the longitudinal direction of said body structure.

5. The apparatus of claim 3, wherein said electrode shape is an exponential function of the longitudinal dimensional variable of said body structure.

6. The apparatus of claim 3, wherein said electrode shape is an exponential function of the superposition of at least two exponential functions.

7. The apparatus of claim 3, wherein said electrode shape is a trigonometric function of the longitudinal dimensional variable of said body structure.

8. The apparatus of claim 3, wherein said electrode shape is an trigonometric function of the superposition of at least two trigonometric functions.

9. The apparatus of claim 3, wherein the first end of said body structure is supported and the second end of said body structure is free from any support.

10. The apparatus of claim 2, wherein said body structure is a cantilever beam.

11. The apparatus of claim 10, wherein said strain pattern in said body structure is related to compression and expansion vibrations in the direction traverse to the longitudinal direction of said body structure.

12. The apparatus of claim 10, wherein said electrode shape is an exponential function of the longitudinal dimensional variable of said elongated rod.

13. The apparatus of claim 10, wherein said electrode shape is an exponential function of the superposition of at least two exponential functions.

14. The apparatus of claim 10, wherein said electrode shape is a trigonometric function of the longitudinal dimensional variable of said elongated rod.

15. The apparatus of claim 10, wherein said electrode shape is an trigonometric function of the superposition of at least two trigonometric functions.

16. The apparatus of claim 10, wherein the first end of said body structure is supported and the second end of said body structure is free from any support.

* * * * *